(12) United States Patent
Escriche et al.

(10) Patent No.: US 12,163,473 B2
(45) Date of Patent: Dec. 10, 2024

(54) CONTAMINATION ACCUMULATION MODELING

(71) Applicant: General Electric Company, Schenectady, NY (US)

(72) Inventors: Lorenzo Escriche, Ross Township, OH (US); Charles Larry Abernathy, West Chester, OH (US); Daniel John Maggard, Cincinnati, OH (US)

(73) Assignee: General Electric Company, Evendale, OH (US)

( * ) Notice: Subject to any disclaimer, the term of this patent is extended or adjusted under 35 U.S.C. 154(b) by 409 days.

(21) Appl. No.: 17/582,239

(22) Filed: Jan. 24, 2022

(65) Prior Publication Data
US 2022/0144454 A1 May 12, 2022

Related U.S. Application Data

(63) Continuation of application No. 16/045,049, filed on Jul. 25, 2018, now Pat. No. 11,268,449.
(Continued)

(51) Int. Cl.
*F02C 7/30* (2006.01)
*B08B 3/02* (2006.01)
(Continued)

(52) U.S. Cl.
CPC .................. *F02C 7/30* (2013.01); *B08B 3/02* (2013.01); *B08B 3/024* (2013.01); *B08B 3/026* (2013.01);
(Continued)

(58) Field of Classification Search
None
See application file for complete search history.

(56) References Cited

U.S. PATENT DOCUMENTS 6,364,602 B1 4/2002 Andrew et al.
6,463,380 B1 * 10/2002 Ablett ...................... F02C 9/00
123/674

(Continued)

FOREIGN PATENT DOCUMENTS

DE 102014109711 A1 1/2015
EP 1903188 A2 3/2008
(Continued)

OTHER PUBLICATIONS

Watson et al., Cleaning Turbomachinery Without Disassembly, Online and Offline, Proceedings of the Twenty-Fourth Turbomachinery Symposium, Sep. 26, 1995, pp. 117-128.

*Primary Examiner* — Brent A. Fairbanks
(74) *Attorney, Agent, or Firm* — Dority & Manning, P.A.

(57) ABSTRACT

A wash optimization system and related methods are provided that increase the efficiency and the effectiveness of engine washes. A system comprising at least one processor receives sensor data representing one or more measured parameters of a turbine engine and determines at least one performance parameter based on the sensor data. The at least one performance parameter represents one or more particulate values associated with the turbine engine. The system generates a health state for the turbine engine based on the at least one performance parameter and generates a wash identifier based on the health state of the turbine engine.

20 Claims, 14 Drawing Sheets

Related U.S. Application Data

(60) Provisional application No. 62/562,050, filed on Sep. 22, 2017.

(51) Int. Cl.

| | | |
|---|---|---|
| *B08B 9/00* | (2006.01) | |
| *B08B 13/00* | (2006.01) | |
| *B64F 5/40* | (2017.01) | |
| *F01D 21/00* | (2006.01) | |
| *F01D 21/10* | (2006.01) | |
| *F01D 25/00* | (2006.01) | |
| *F04D 27/00* | (2006.01) | |
| *F04D 29/70* | (2006.01) | |
| *G05B 23/02* | (2006.01) | |
| *G06F 30/20* | (2020.01) | |
| *G06Q 10/20* | (2023.01) | |
| *G07C 5/00* | (2006.01) | |

(52) U.S. Cl.
CPC .............. *B08B 9/00* (2013.01); *B08B 13/00* (2013.01); *B64F 5/40* (2017.01); *F01D 21/003* (2013.01); *F01D 21/10* (2013.01); *F01D 25/002* (2013.01); *F04D 27/001* (2013.01); *F04D 29/701* (2013.01); *G05B 23/0283* (2013.01); *G06F 30/20* (2020.01); *G06Q 10/20* (2013.01); *G07C 5/006* (2013.01); *F05D 2220/323* (2013.01); *F05D 2260/80* (2013.01); *F05D 2260/81* (2013.01); *F05D 2260/821* (2013.01); *F05D 2270/11* (2013.01)

(56) References Cited

U.S. PATENT DOCUMENTS

| | | | |
|---|---|---|---|
| 6,473,677 B1* | 10/2002 | Hershey | F01D 25/002 340/945 |
| 8,720,206 B2 | 5/2014 | McMahan et al. | |
| 9,835,048 B2 | 12/2017 | Griffiths et al. | |
| 10,041,373 B2 | 8/2018 | Vela et al. | |
| 10,254,752 B2* | 4/2019 | Panov | G05B 23/0283 |
| 2004/0016445 A1* | 1/2004 | Koch | C11D 3/02 122/379 |
| 2005/0114088 A1* | 5/2005 | Gorden | G01M 15/05 702/185 |
| 2006/0219269 A1* | 10/2006 | Rice | B08B 3/02 134/169 R |
| 2007/0088570 A1* | 4/2007 | Shetty | G05B 23/0254 705/2 |
| 2007/0198223 A1* | 8/2007 | Ella | G06Q 50/06 702/182 |
| 2008/0016971 A1* | 1/2008 | Bunce | F01D 21/003 73/114.74 |
| 2008/0173330 A1* | 7/2008 | Wagner | B08B 3/00 134/113 |
| 2008/0201104 A1* | 8/2008 | Poncet | G05B 23/0278 702/181 |
| 2008/0221835 A1* | 9/2008 | Volponi | G05B 23/0278 701/100 |
| 2008/0250769 A1 | 10/2008 | Wagner et al. | |
| 2009/0112519 A1* | 4/2009 | Novis | F01D 21/14 702/183 |
| 2009/0133718 A1* | 5/2009 | Lebold | F04D 29/705 415/13 |
| 2010/0023238 A1* | 1/2010 | Adibhatla | G05B 23/0289 701/100 |
| 2010/0101409 A1* | 4/2010 | Bromberg | B01D 46/444 96/397 |
| 2010/0102835 A1 | 4/2010 | Chillar et al. | |
| 2010/0257838 A1 | 10/2010 | Mazzaro et al. | |
| 2010/0274640 A1* | 10/2010 | Morey | B08B 13/00 709/224 |
| 2010/0275404 A1* | 11/2010 | Myers | F01D 25/002 15/316.1 |
| 2011/0041816 A1* | 2/2011 | Hsia | F02B 77/082 123/568.21 |
| 2011/0112991 A1* | 5/2011 | Scheid | G06Q 99/00 705/500 |
| 2012/0290104 A1* | 11/2012 | Holt | G06Q 10/00 706/14 |
| 2013/0298944 A1* | 11/2013 | Mundinger | F01D 25/002 134/22.12 |
| 2014/0174474 A1* | 6/2014 | Ekanayake | G01N 17/008 134/18 |
| 2014/0303832 A1* | 10/2014 | Skertic | G05B 19/406 701/29.6 |
| 2014/0316673 A1* | 10/2014 | Glugla | F02P 3/051 180/65.28 |
| 2014/0326225 A1* | 11/2014 | Shioda | F01M 13/00 123/559.1 |
| 2015/0118014 A1 | 4/2015 | Elward et al. | |
| 2015/0275753 A1* | 10/2015 | Pfister | F02D 41/22 702/35 |
| 2015/0354442 A1* | 12/2015 | Morelli | F02B 37/24 123/568.16 |
| 2016/0076455 A1 | 3/2016 | Ekanayake et al. | |
| 2016/0160679 A1* | 6/2016 | Griffiths | F01D 21/003 134/57 R |
| 2016/0222820 A1* | 8/2016 | Truesdale | F01D 25/002 |
| 2016/0240017 A1* | 8/2016 | Lacaille | G07C 5/0841 |
| 2017/0268377 A1* | 9/2017 | Flynn | B08B 9/00 |
| 2018/0010481 A1 | 1/2018 | Dauenhauer et al. | |
| 2018/0051589 A1* | 2/2018 | Griffiths | B64F 5/30 |
| 2018/0068498 A1* | 3/2018 | Hodge | G01M 15/14 |
| 2018/0155060 A1* | 6/2018 | Dauenhauer | B64F 5/30 |
| 2018/0283278 A1* | 10/2018 | Adibhatla | F01D 21/14 |
| 2018/0297718 A1* | 10/2018 | Adibhatla | G07C 5/006 |
| 2018/0300191 A1* | 10/2018 | Bengea | G06F 11/0703 |
| 2018/0306054 A1 | 10/2018 | Adibhatla | |
| 2019/0078462 A1* | 3/2019 | Baskaran | B05B 1/14 |
| 2019/0093505 A1* | 3/2019 | Escriche | B64F 5/30 |

FOREIGN PATENT DOCUMENTS

| | | |
|---|---|---|
| EP | 2180146 A2 | 4/2010 |
| EP | 3029275 A1 | 6/2016 |
| EP | 3051075 A1 | 8/2016 |
| EP | 3330821 A2 | 6/2018 |
| EP | 3392469 A2 | 10/2018 |
| WO | WO2017/043959 A1 | 3/2017 |

* cited by examiner

CONTAMINATION ACCUMULATION MODELING

CROSS-REFERENCE TO RELATED APPLICATIONS

The present application is a continuation of U.S. patent application Ser. No. 16/045,049, filed Jul. 25, 2018, which claims the benefit of priority of U.S. Provisional Patent Application No. 62/562,050, "CONTAMINATION ACCUMULATION MODELING," filed Sep. 22, 2017, the contents of which are incorporated herein by reference in their entirety as if set forth verbatim.

FIELD

The present disclosure relates generally to jet engine maintenance.

BACKGROUND

An aerial vehicle can rely on one or more jet engines to control the aerial vehicle. Engine performance can be affected by cleanliness of the engine. Washing the engine regularly can improve the performance of the engine and extend the life of the engine. However, different types of engine washes can have different costs and different levels of effectiveness. It can be difficult to determine an appropriate engine wash.

BRIEF DESCRIPTION

Aspects and advantages of the disclosed technology will be set forth in part in the following description, or may be obvious from the description, or may be learned through practice of the invention.

According to example aspects of the disclosed technology, there is provided a method, comprising: receiving, by a system comprising at least one processor, sensor data representing one or more measured engine parameters of a turbine engine; determining, by the system, at least one performance parameter based on the sensor data, the at least one performance parameter representing one or more particulate values associated with the turbine engine; generating, by the system, a health state associated with the turbine engine using the one or more particulate values; and generating, by the system, a wash identifier based on the health state of the turbine engine.

According to example aspects of the disclosed technology, there is provided a computing device, comprising: one or more storage devices comprising processor readable code; and one or more processors in communication with the one or more storage devices, the one or more processors execute the processor readable code to: receive a first set of one or more performance parameters based on engine sensor data prior to at least one wash event and a second set of one or more performance parameters based on engine sensor data subsequent to the at least one wash event, the first and second sets of performance parameters representing one or more particulate values associated with the turbine engine; determine a recovery parameter based on a difference between the first set of performance parameters and the second set of performance parameters; generate a contamination accumulation model based on the recovery parameter; and generate a wash identifier based on the contamination accumulation model.

According to example aspects of the disclosed technology, there is provided a non-transitory computer-readable medium storing computer instructions, that when executed by one or more processors, cause the one or more processors to perform the steps of: receiving, by a system comprising at least one processor, sensor data representing one or more measured engine parameters of a turbine engine; determining, by the system, one or more particulate values based on the sensor data; determining, by the system, a health state associated with the turbine engine using the one or more particulate values; determining, by the system, that the health state satisfies a threshold; and generating, by the system, a wash advisory output in response to determining that the health state satisfies a threshold.

These and other features, aspects and advantages of the disclosed technology will become better understood with reference to the following description and appended claims. The accompanying drawings, which are incorporated in and constitute a part of this specification, illustrate embodiments of the disclosed technology and, together with the description, serve to explain the principles of the disclosed technology.

BRIEF DESCRIPTION OF THE DRAWINGS

A full and enabling disclosure of the present disclosure, including the best mode thereof, directed to one of ordinary skill in the art, is set forth in the specification, which makes reference to the appended figures, in which.

DETAILED DESCRIPTION

Figure 1:
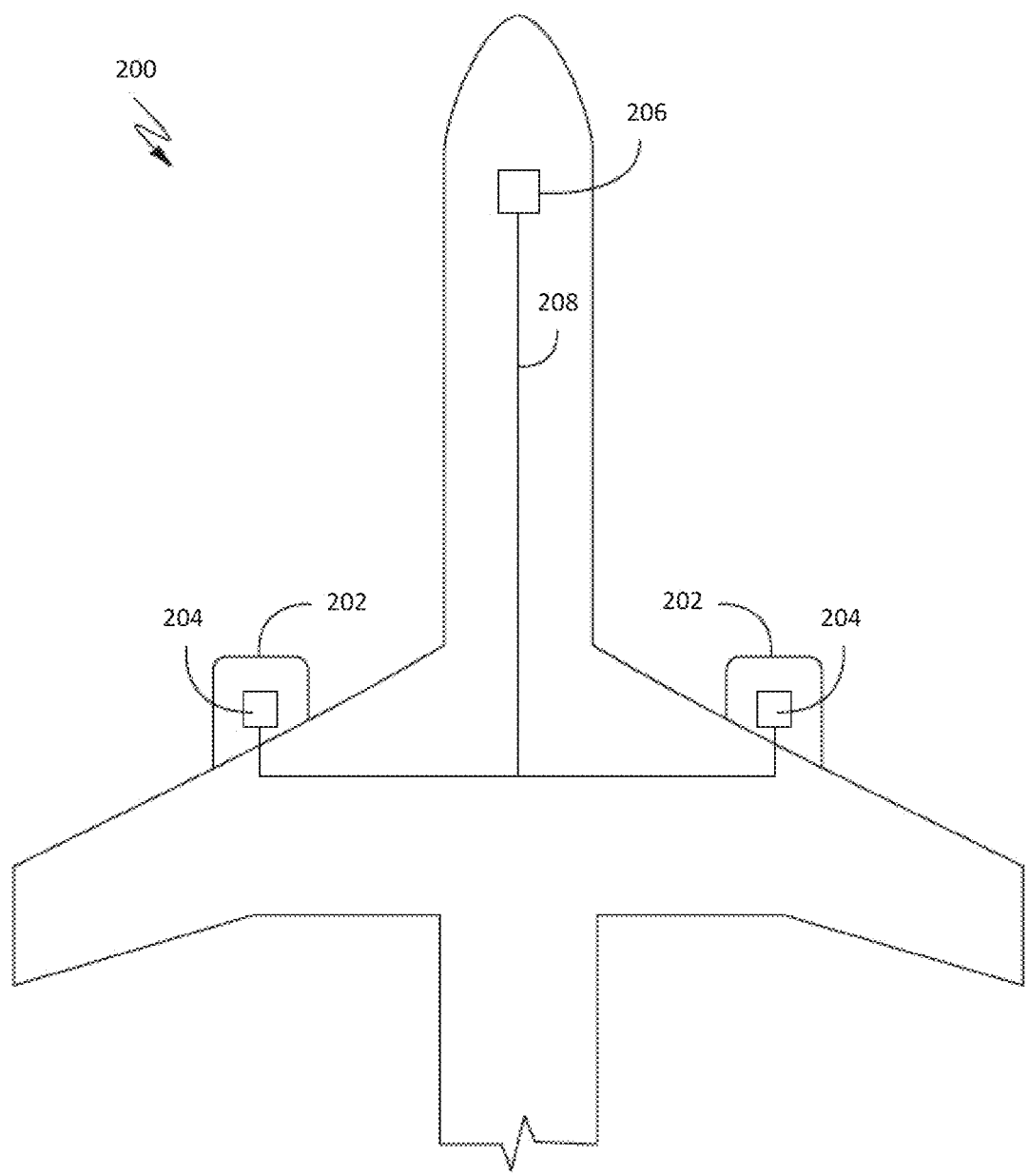
FIG. 1 depicts an aerial vehicle in accordance with example embodiments.

Reference now will be made in detail to embodiments of the disclosure, one or more examples of which are illustrated in the drawings. Each example is provided by way of explanation, not limitation of the disclosed embodiments. In fact, it will be apparent to those skilled in the art that various modifications and variations can be made in the present disclosure without departing from the scope or spirit of the claims. For instance, features illustrated or described as part of example embodiments can be used with another embodiment to yield a still further embodiment. Thus, it is intended that the present disclosure covers such modifications and variations as come within the scope of the appended claims and their equivalents.

Example aspects of the present disclosure are directed to systems and methods for jet engine maintenance, and more particularly, to techniques for optimizing cleaning of a jet engine. The accumulation of contaminants within jet engine components such as the compressor and turbine result in deterioration in engine performance over time. The contaminants restrict air flow through the engine, resulting in a loss of engine efficiency as more fuel is burned to maintain a desired level of engine performance. Washing an engine can remove engine contaminants and reduce performance deteriorations. Traditionally engine maintenance including washing are performed according to predefined maintenance schedules. These maintenance schedules do not typically consider the actual performance and/or condition of an engine in making wash decisions. Instead, traditional techniques rely on simple operational data such as flight time to determine when to wash an engine. These schedules do not consider how a particular engine may be affected by different types, durations, timings, and delivery methods of an engine wash.

According to example embodiments of the disclosed technology, a system and method of jet engine maintenance are provided that utilize contamination accumulation modeling to predict or project particulate accumulations within a turbine engine. The system can assess the recovery associated with wash events to develop a contaminant accumulation model. The system can then use the model to determine particulate accumulations based on sensor data. Based on particulate calculations, the system can optimize wash timings to maximize hardware life.

In some embodiments, particulate accumulation information is used to determine a health state associated with an engine based on contaminate accumulation modeling. Using the performance parameters that represent contamination, the system optimizes washing for the engine. For example, the system can compare a measured health state of an engine or component to a reference state. If a difference between the measured health state and reference state satisfies a threshold, the system can generate a wash identifier, such as by generating and transmitting a signal including the wash identifier. The wash identifier can trigger a wash event. In some embodiments, the wash identifier identifies the wash event, and optionally indicates a wash type, scope, duration, timing, etc.

In some embodiments, the system receives sensor data that represents measured engine parameters. The system determines performance parameters that represent a measured condition and/or performance of the engine. In some embodiments, the performance parameters include a particulate parameter that represents contamination within the engine. The system can update performance parameters automatically and over time as additional sensor data is received. Based on the particulate accumulations as represented by the performance parameters, the system generates a health state for the engine and/or one or more components of the engine. The system can generate historic, current, and/or a predicted health state of the engine. Using the health state information, the system generates wash identifiers to optimize cleaning of the engine and therefore, maximize the useful life of the engine and/or its components. In some embodiments, the health state comprises one or more performance parameters.

The system may use additional performance parameters as part of generating wash identifiers based on measured condition and/or performance. In some embodiments, the system determines a compressor efficiency parameter, such as a value indicating a current or predicted efficiency of the compressor. In some embodiments, the system determines a compressor performance parameter. Similarly, the system can determine a turbine efficiency and/or performance parameter.

In some embodiments, the system generates a wash identifier indicating a wash type, wash timing, and/or wash scope. A wash type can include one or more of a wash medium, wash duration, and wash delivery method or system. By way of example, the wash identifier may identify an external wand delivery of water for a predetermined duration or an wash line internal delivery method of a foam cleaning medium be used for another predetermined duration.

A wash timing identifier can identify a particular timing for or interval during which to perform the engine wash. The system can optimize the timing to extend hardware life and efficiently maintain engines without unnecessary cost.

A wash scope identifier identifies a scope of the wash, including a thoroughness and/or identification of particular engine or component locations to wash. The wash scope identifier can identify components of the delivery system to use such as valves or wash lines in order to target particular portions of an engine.

An improved system for automating wash determinations for jet engine maintenance is provided. A processor-based system is configured as a specialized device that provides efficient and accurate determinations for an engine wash based on sensor data representing measured engine parameters. The automated conversion of sensor data into performance parameters and a health state, and subsequent comparison with reference state information more accurately determines when an engine wash should be performed, how it should be performed, and to what areas the wash should be applied. An improved computational performance is achieved, while providing increased turbine engine performance through efficient and automated maintenance scheduling.

FIG. 1 depicts an example aerial vehicle 200 in accordance with example embodiments of the present disclosure. The aerial vehicle 200 can include one or more engines 202, one or more sensors 204, a computing system 206, and a communication bus 208 to connect at least one of the one or more sensors 204 with the computing system 206. The one or more sensors 104 can detect one or more parameters related to engine performance, such as Exhaust Gas Temperature (EGT), EGT Hot Day Margin (EGTHDM), fuel burn, modular efficiency, other analytic measures of engine performance, the like, and/or any combination of the foregoing. The one or more sensors 204 can communicate the one or more detected parameters to the computing system 206 via the communication bus 208. The computing system 206 can be, for example, the computing system 600 described in more detail in FIG. 14. The computing system 206 can transmit the detected one or more parameters to a computing system associated with a ground system.

The numbers, locations, and/or orientations of the components of example aerial vehicle 200 are for purposes of illustration and discussion and are not intended to be limiting. Those of ordinary skill in the art, using the disclosures provided herein, shall understand that the numbers, locations, and/or orientations of the components of the aerial vehicle 200 can be adjusted without deviating from the scope of the present disclosure.

Figure 2:
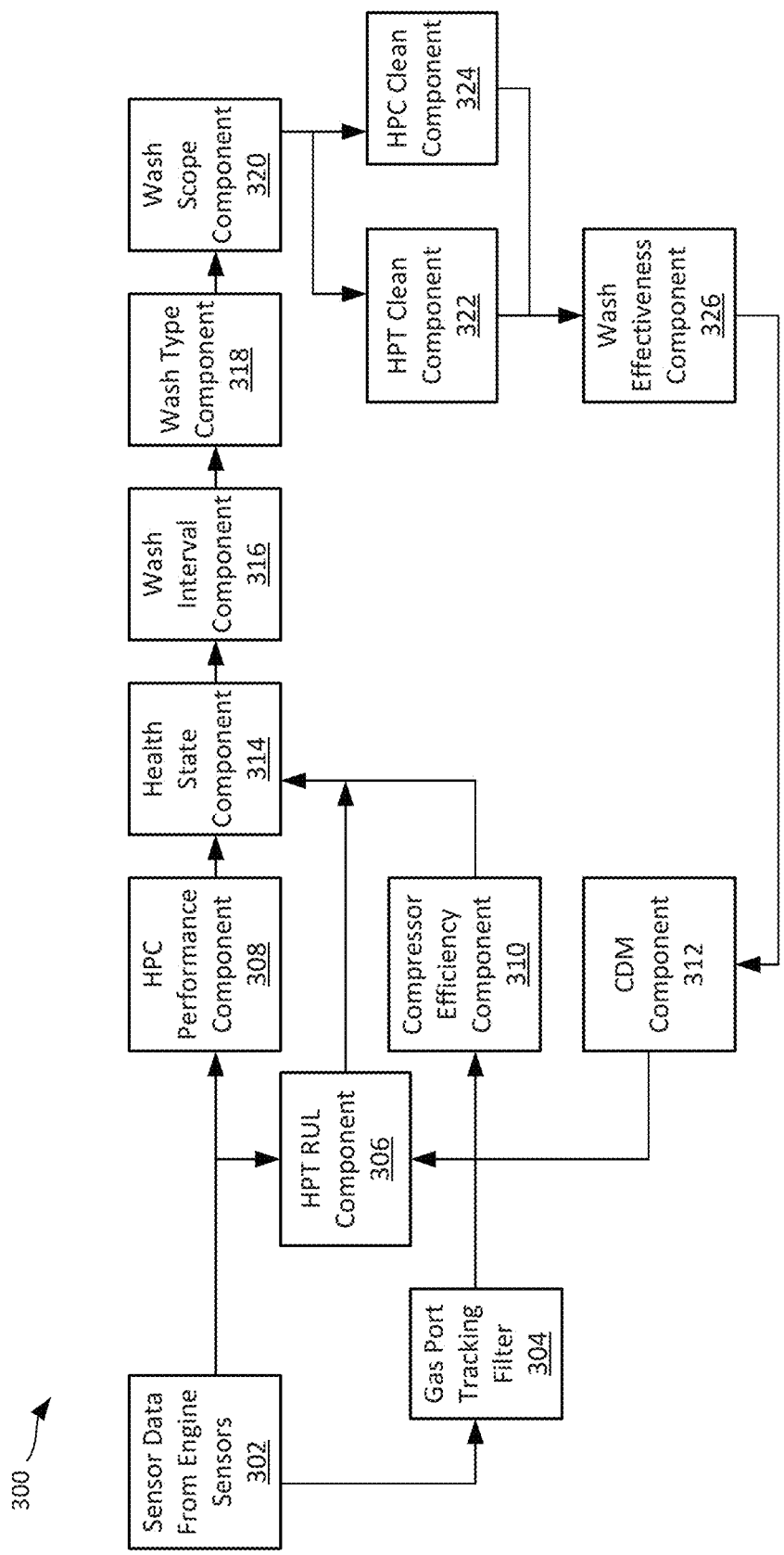
FIG. 2 is a block diagram of a wash optimization system in accordance with example embodiments.

FIG. 2 is a block diagram of a wash optimization system 300 according to example embodiments of the disclosed technology. In one example, system 300 is implemented using one or more computing devices, such as one or more servers, client devices, and/or network devices. The one or more computing systems are one or more computing systems 600 in one example. Wash optimization system 300 may be implemented in a control system aboard an aerial vehicle, such as by computing system 206, or can be implemented as a ground-based system that receives sensor and/or other information from an aerial vehicle.

Increased efficiency may result from increased airflow within the engine as a result of washing. Different types of engine washes may have different effectiveness levels in reducing engine deterioration. A water-wash in often applied to a turbine engine to remove contaminants. Flushing the engine compressors may remove dirt, sand, and/or other contaminants that accumulate over time. Other cleaning mediums such as a water and detergent combination, water and Isopropyl alcohol combination, foaming solution, and the like can also be used. An engine wash can be applied for different durations and with various delivery methods. For example, a wand can be positioned externally adjacent to the engine to deliver a cleaning medium to the engine. Alternatively, wash lines can be used that are coupled to one or more portions of the engine to directly provide the cleaning medium to or within the engine. FIG. 2 describes a system that optimizes washing of an engine based on condition and/or performance information of the engine.

Wash optimization system 300 includes a gas port tracking filter 304, high-pressure turbine (HPT) remaining useful life (RUL) component 306, high-pressure performance component 308, compressor efficiency component 310, cumulative damage component 312, health state component 314, wash interval component 316, wash type component 318, wash scope component 320, HPT clean component 322, HTP clean component 324, and wash effectiveness component 326. The components of system 300 may be configured at a single computing device, or may be distributed across multiple computing devices. Each of the various components may be implemented with hardware, software, or a combination of both hardware and software as hereinafter described.

In general, GPTF 304, HPT RUL component 306, and HPC performance component 308 are configured to receive sensor data 302 from one or more sensors of a turbine engine. The sensor data represents one or more engine parameters measured from the jet engine. Various sensor data 302 may be used with embodiments of the disclosed technology. By way of example and not limitation, sensor data 302 may include environmental data and/or operational data. In one example, environmental data may include ambient pressures, temperatures, altitudes, humidity, latitude, longitude, flight city, and/or particulates. Particulates can include any type of particulate such as multiple dust/sand types, pollution/haze, sea salt, smoke, volcanic ash and sulfates. In one example, operational data may include engine parameters such as gas turbine temperatures, pressures, fuel flow, rotor speeds, bleeds(all types), horsepower extraction, length of flight, and/or derived parameters based on operational conditions.

Although not shown, components 304, 306, and 308 may receive and/or generate additional data such as product parameters. Product parameters may include modular health state, accumulated conditions in parts which may be related to environmental factors, and/or derived damage factors based on models or analytics. Some other examples include modular component efficiencies, flows and pressure ratios.

GPTF 304 receives sensor data 302 to track and analyze the sensor data over time. The GPTF can be used to determine the effects of component deterioration, sensor biases, engine to engine variations, etc. The tracking filter can be used to adjust model outputs to match sensor outputs. For example, sensor data including analog signals such as current, resistance, or voltage may be received from a sensor. For example, the turbine engine sensor can measure rotor speed, temperature, pressure, etc. The tracking filter can covert or scale sensor data to provide a sensor output in a standard units form such as in units of psi, rpm, etc.

In some embodiments, GPTF 304 is configured to compare calculated engine parameter values with expected engine parameters. Expected engine parameters can be determined using a reference state as hereinafter described. Expected engine parameters may be defined by an engine model. GPTF 304 may generate performance modifiers in some embodiments that indicate a difference between expected and calculated engine parameters. The calculated engine parameters and/or performance modifiers are provided to compressor efficiency component 310.

Compressor efficiency component 310 is configured to calculate a compressor efficiency parameter in some embodiments. The efficiency parameter is calculated based on the calculated engine parameter and/or performance modifiers. The compressor efficiency parameter is one example of a performance parameter representing a measured performance of the turbine engine. The efficiency parameter can represent low or high pressure compressor component efficiency. The efficiency parameter can include cooling flows, bleeds, pressure losses, etc. In example embodiments, the compressor efficiency component 310 can generate a compressor performance parameter of the turbine engine based on sensor data. Component 310 can generate a compressor efficiency parameter of the turbine engine based on the sensor data. A health state of an engine can be determined by comparing the compressor performance parameter to an expected compressor performance parameter and comparing the compressor efficiency parameter to an expected compressor performance parameter. In some examples, generating a compressor efficiency parameter comprises applying a gas port tracking filter to the sensor data.

HPC performance component 308 is configured to receive sensor data 302 and calculate one or more performance parameters representing a measured performance of the engine's HPC.

HPT RUL component 306 is configured to receive sensor data 302 as well as a cumulative damage model (CDM) from CDM component 312. HPT RUL component 306 calculates one or more performance parameters including a remaining useful life (RUL) associated with the engine or a particular component of the engine. In example embodiments, HPT RUL component 306 can generate a useful life parameter for the turbine engine based on the sensor data and a cumulative damage model for the turbine engine.

Health state component 314 is configured to generate one or more health states for the turbine engine based on the outputs of the HPC performance component 308, HPT RUL component 306, and compressor efficiency component 310.

The health state component 314 generates a health state based on the measured condition or performance of the turbine engine as represented in the received performance parameters. A health state generated by component 314 may include health state information for the turbine engine, and/or health state information for an individual component of the turbine engine such as the compressor or turbine.

Wash interval component 316 receives health state information from component 314 and determines an optimal wash interval or timing of a next wash event for the turbine engine. The wash interval component can analyze the health state information to determine an optimal timing to maximize the hardware life of the turbine engine.

Wash type component 318 determines a wash type for the next wash event based on the health state information. A wash type may include a wash duration, cleaning medium, and/or wash delivery technique. For example, the wash type component 318 may determine that a water wash should be used with a wand delivery mechanism in response to first health state information and that a foam wash should be used with an internal wash line delivery mechanism in response to second health state information. The first health state information may indicate a level of deterioration that is less that a level of deterioration indicated by the second health state information.

Wash scope component 320 determines a wash scope for the next wash event based on the health state information. The wash scope may indicate a thoroughness of the wash in one example. The wash scope may identify particular portions or components of the turbine engine to be washed. For example, the wash scope may identify particular borescope holes or inlet nozzles at which to apply a wash medium. The wash scope may additionally or alternatively identify particular portions of a wash delivery mechanism, such as particular wash lines, to be activated for the discharge of the cleaning medium to the turbine engine.

HPT clean component 322 is configured to receive wash event information from wash scope component 320 and trigger a wash of the HPT. In some embodiments, HPT clean component 322 generates an identifier for a wash of the HPT. Similarly, HPC clean component is configured to receive wash event information from wash scope component 320 and trigger a wash of the HPC. In some embodiments, HPC clean component 324 generates an identifier for a wash of the HPC. In one example, wash interval component 314, wash type component 318, wash scope component 320, HPC and HPT clean components 322 and 324 are subsystems of a wash decision component. The wash identifier component is configured to generate wash identifiers indicating wash intervals, types, scopes, and/or components for washing.

Wash effectiveness component 326 receives information from the clean components 322 and 324 and determines a level of effectiveness of a wash event. Component 326 generates an output that is used by CDM component 312 to update the cumulative damage model of the engine or engine part. In example embodiments, component 326 may determine a projected measure of remaining useful life associated with the engine such that generating the wash identifier is based on the projected measure of remaining useful life. In some examples, the projected performance recovery is of a compression section of the turbine engine and the projected measure of remaining useful life is of the compression section.

Figure 3:
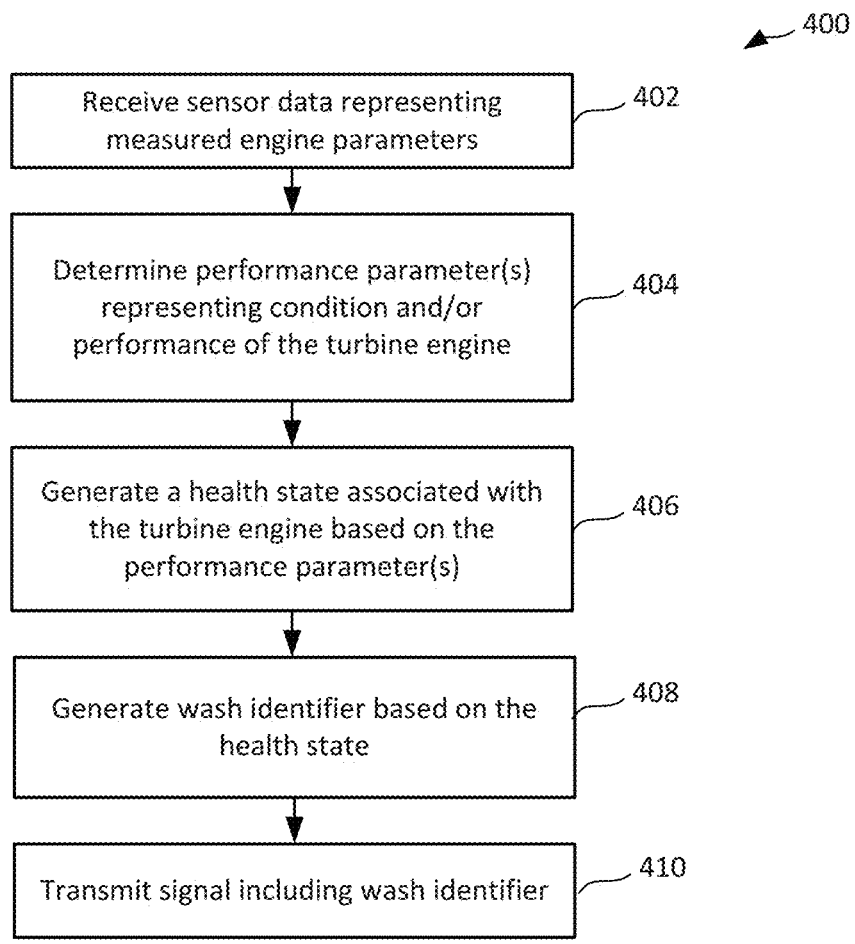
FIG. 3 is a flowchart describing example embodiments of a process for optimizing wash events for a turbine engine.

FIG. 3 is a flowchart describing a process 400 for optimizing wash events for a turbine engine. Process 400 may be performed to generate a health state based on engine condition and/or performance, and to generate a wash identifier based on the health state. Process 400 may be performed by a wash optimization system 300 in some embodiments, however, process 400 is not limited to such environments. Process 300 may be implemented by a server or other computing device to determine health state information and generate wash identifiers such as a signal indicating a wash event. Process 400 may be performed by one or more devices, such as one or more circuits or one or more specialized network devices configured to perform the described operations. Process 400 may alternatively be implemented in whole or in part by a processor, as processor readable code for programming a processor for example. Process 400 depicts a particular order of the described blocks for purposes of illustration and discussion. Those of ordinary skill in the art, using the disclosures provided herein, will understand that various blocks of any of the methods disclosed herein can be adapted, modified, rearranged, or modified in various ways without deviating from the scope of the present disclosure.

At 402, the system receives sensor data representing measured engine parameters of a turbine engine. In some embodiments, 402 is performed by GPTF 304, HPT RUL component 306, and/or HPC performance component 308. In another example, block 402 is performed by data reduction component 510 described hereinafter.

The sensor data can be obtained from one or more sensors 204 in one example. In another example, the sensor data can be obtained from a database or other storage location. The sensor data includes or represents measured parameters of the turbine engine. By way of example, the measured parameters may include operational data such as gas turbine temperatures, pressures, fuel flow, rotor speeds, bleeds(all types), horsepower extraction, length of flight, and/or derived parameters based on operational conditions. The measured parameters may additionally or alternately include environmental data such as ambient pressures, temperatures, altitudes, humidity, latitude, longitude, flight city, and/or particulates that include all types such as multiple dust/sand types, pollution/haze, sea salt, smoke, volcanic ash and/or sulfates.

At 404, the system determines at least one performance parameter based on the sensor data. In some embodiments, block 404 is performed by HPT RUL component 306, HPC performance component 308, and/or compressor efficiency component 310. In another example, block 402 is performed by data reduction component 510.

The performance parameters are calculated from the measured engine parameters in one example. For example, the performance parameters may include a modular health indicator of one or more components of the engine or an accumulated condition of one or more component. An accumulated condition may be calculated based on environmental data and/or derived damage factors based on models and/or analytics. By way of example, performance parameters may include modular component efficiencies such as HPT efficiency or HPC efficiency, air and fuel flow ratess, and/or pressure ratios. Performance parameters may also include residual EGT, residual gas turbine temperature, or residual fuel flow to a particular engine component.

In example embodiments, performance parameters may include derived parameters such as contamination levels determined based on sensor data. A contamination performance parameter may indicate a level of contaminants within an engine, engine component or module, or engine part. A contamination performance parameter is a calculated amount of particulates that either block cooling passages or cause a thermal layer which impacts cooling air effectiveness in some embodiments.

Performance parameters are generated using one or more models in one example. A model can comprise a look-up table model or a physics-based model (e.g., an aero-thermodynamic model) in one example. The model characterizes the turbine engine by estimating outputs based on inputs. The model inputs can include sensor data such as actuator positions, temperatures, pressures, altitude, etc. and the outputs can include processed sensor data including performance parameters such as pressure ratios, temperature ratios, thrust, stall margins, etc. A model output can be calculated as an estimate for the sensor output based on a set of operating conditions or parameters of the turbine engine in the model. The system may utilize one or more contamination accumulation models to determine a contamination performance parameter.

At 406, the system generates a health state for the turbine engine based on the performance parameter(s). In some embodiments, block 406 is performed by health state component 314. In another example, block 406 is performed by data reduction component 510.

In some embodiments, the health state represents an accumulated health condition of the engine and/or a component of the engine. For example, a health state may be determined for the overall engine, and/or for one or more components of the engine such as the compressor or turbine. In some embodiments, the health state is a value representing multiple performance parameters associated with the engine or component. The health state is an identifier of an engine's or a component's condition and/or performance. The health state may represent an amount of degradation associated with the engine or component, or an amount of operational life remaining for the engine or component. In some embodiments, a health state is calculated based on a contamination accumulation model indicating particulate accumulations within the engine.

The system may also generate a reference state for the engine or one or more engine components. The reference state may be based on accumulated and/or normalized sensor data over time for one or more engines. The reference state may represent an expected condition or performance of one or more engine parameters. The reference state can simulate a turbine engine and be determined based on the model of the turbine engine representing engine parameters under different environmental and operating conditions. The reference state provides reference information including expected performance parameters of an engine based on particular operational and/or environmental data. In some embodiments, block 406 includes comparing a current or projected health state with a reference state.

At 408, the system generates a wash identifier based on the health state of the engine or engine component. In some embodiments, block 408 is performed by wash interval component 316, wash type component 318, and/or wash scope component 320. In another example, block 408 is performed by wash decision component 522.

In some embodiments, a wash identifier is conditionally generated based on the health state. A wash identifier may be generated based on the health state satisfying a threshold criterion. For example, the system may generate a wash identifier in response to determining that a difference between a health state and reference state satisfies a threshold criterion in one example, such as by the difference meeting or exceeding a threshold difference. In some embodiments, a wash identifier is generated in response to determining that a difference between individual performance parameters associated with a reference state and health state satisfies a threshold criterion.

Various wash identifiers may be generated at block 408. In one example, the wash identifier is an indication that an engine wash should be performed for a selected engine. The wash identifier may additionally include a wash type identifier, a wash timing or interval identifier, and/or a wash scope identifier.

At 412, the system transmits a signal such as an output signal including the wash identifier. In one example, the signal indicates a notification of a wash event. In some embodiments, the signal is transmitted to a computing device associated with a technician. The signal generates an output indicating to a technician that a wash event should be performed. In another embodiment, the signal is transmitted to an automated cleaning system. In response to the signal, the system automatically performs the indicated wash event, including a wash type, timing, and/or scope.

Figure 4:
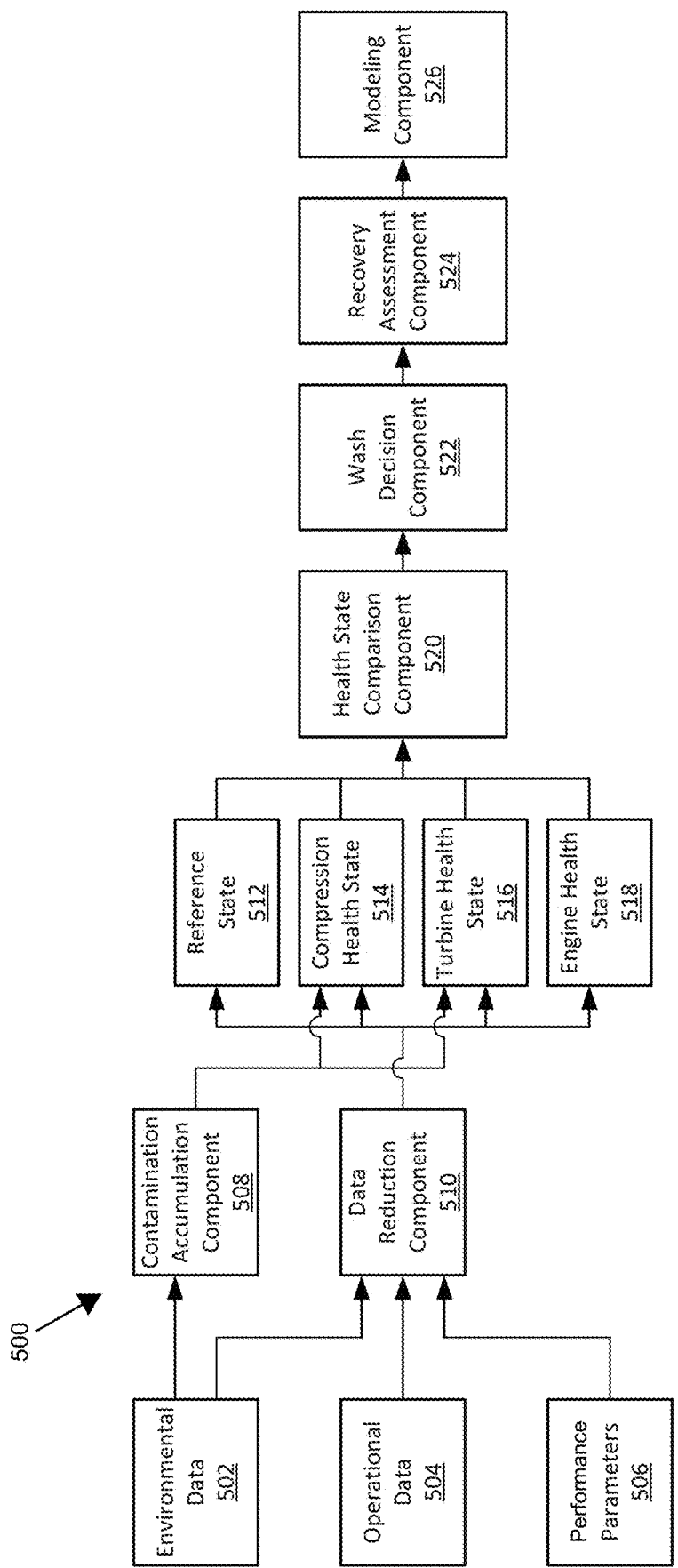
FIG. 4 is a block diagram of a wash optimization system in accordance with example embodiments.

FIG. 4 is a block diagram of a wash optimization system 500 in accordance with example embodiments of the disclosed technology. Wash optimization system 500 provides additional details of wash optimization system 300 in one example. In one example, system 500 is implemented using one or more computing devices, such as one or more servers, client devices, and/or network devices. The one or more computing systems are one or more computing systems 600 in one example. Wash optimization system 500 may be implemented in a control system aboard an aerial vehicle, such as by computing system 206, or can be implemented as a ground-based system that receives sensor and/or other information from an aerial vehicle.

Wash optimization system 500 includes a contamination accumulation component 508, data reduction component 510, health state comparison component 520, wash decision component 522, recovery assessment component 524, and modeling component 526. The components of system 500 may be configured at a single computing device, or may be distributed across multiple computing devices. Each of the various components may be implemented with hardware, software, or a combination of both hardware and software as hereinafter described.

Data reduction component 510 receives sensor data including measured engine parameters such as environmental data 502 and/or operational data 504. Data reduction component 510 processes the measured data and determines one or more performance parameters 506 associated with the engine. The data reduction component can make engine and modular health state calculations, including historical, current and predictive parameter calculations. In additional to health state calculations, the reduction component may provide physics-based models that provide thermodynamically balanced solutions to provide modular health states.

In some embodiments, the performance parameters represent a condition and/or performance of the turbine engine. The performance parameters are derived from the measured engine parameters to represent actual condition or performance of the engine. The performance parameters are generated by aggregating sensor data over time in some embodiments to generate actual and/or expected performance parameters over the engine life. Unlike measured engine parameters which indicate operational or environmental conditions alone, performance parameters indicate an actual performance or condition of the engine or component as a result of the engine parameters. By way of specific example, the performance parameters may include accumulated condition information, modular component efficiencies, pressure ratios, and air and fuel flows.

Data reduction component 510 generates various health state information based on the performance parameters. In the example of FIG. 4, data reduction component 510 generates a reference state 512, compression health state 514, turbine health state 516, and engine health state 518. In other examples, additional or fewer health states may be generated. Reference state 512 represents expected performance parameters of an engine or model type. The reference state 512 can be generated based on sensor data received over time. The system can track components and engines to develop expected performance parameter values. The sensor data is processed to determine the expected performance parameters.

Engine health state 518 represents an overall system health associated with the engine. Similarly, turbine health state 516 represents a health of the turbine system. Compression health state 514 represents a health of the compression system. In one example, a health state is generated based on the calculated performance parameters from the sensor data. The performance parameters associated with an engine or component can be combined to develop a health state that includes a value indicating a health of the engine or component in one example.

The data reduction component can track any part and provide remaining useful life (RUL) or similar parameters. The component can run automatically and continuously with the arrival of new sensor data.

Health state comparison component 520 compares an actual health state associated with an engine or component with a reference state for the engine or component. In some embodiments, comparison component 520 compares individual performance parameters of an engine health state 518 or component health state 514 or 516 with expected performance parameters in a reference state 512. For example, a difference between actual performance parameters associated with an engine or component can be compared with expected performance parameters. In another example, the system compares an overall health state value for the selected engine or component with a reference state value for the selected engine or component.

Wash decision component 522 determines whether a wash event should be performed based on the health state comparison results. For example, if the difference between actual engine or component health and expected engine or component health satisfies a threshold criterion, a wash can be scheduled and/or a wash identifier generated. For example, if the difference exceeds a threshold difference, a wash identifier may be generated.

Wash decision component 522 may determine a wash type, wash timing, and/or wash scope in association with a wash event. Decision component 522 can generate a wash identifier that indicates the determined wash type, timing, and/or scope.

Recovery assessment component 524 determines an actual performance recovery achieved by one or more wash events. The recovery assessment component may compare engine parameters prior to and after a wash event to assess recovery. The assessment component may alternately or additionally compare performance parameters determined from sensor data. In some embodiments, assessment component 524 determines a value representing an actual performance recovery associated with the engine. The assessment component 524 may compare the actual recovery with an expected performance recovery of the wash event. This information may be provided back to wash decision component 522 which may use the information to determine whether an additional wash should be performed. Additionally, an output of the assessment component may be used to determine compressor performance parameters and/or turbine RUL parameters.

Modeling component 526 is configured to reset or update various models based on the recovery assessment. For example, predictive and/or diagnostic models (e.g., the damage model generated by CDM component 312) may be updated based on the recovery assessment.

According to some embodiments, the wash optimization system tracks engine health such as compression system health over time as part of optimizing the timing of washes. As part of health tracking in some embodiments, the system measures recovery associated with one or more wash events. For example, recovery assessment component 524 may measure an amount of recovery associated with one or more engine washes. The amount of recovery may be used to generate a recovery parameter value in some embodiments.

In some embodiments, the system measures recoverable and/or non-recoverable health of an engine or module. The assessment component can attribute recoverable and non-recoverable health. Recoverable health is that associated with those environmental elements that deteriorate the engine health but can be removed with washing. Non-recoverable health includes those elements that are attributed to material degradation due to operation of a part. The system can measure and track recoverable health over time as part of modeling engine performance and degradation.

In some embodiments, modeling component 526 tracks the long-term impact of washes and generates one or more models demonstrating the long-term impacts of the washes. In example embodiments, these models can be used by wash decision component 522 to determine an optimal wash timing, for example. Additionally, these models can be used to determine optimal wash mediums, delivery methods, scopes, etc.

In some embodiments, modeling component 526 generates contamination accumulation models based on performance parameters and the measured recovery from wash events. The modeling component can determine and generate a model that demonstrates a level of particulates that are removed during a wash event. The model may demonstrate the impacts on multiple parts of the engine of removing the particulates.

In some embodiments, modeling component 526 integrates the performance recovery and the removal of particulates into one or more models. Such models indicate the impact of removing the particulates and the engine recovery such as compression system recovery by a wash. The system thereby indicates a level of improvement along with a projected level of RUL for an engine, module, or part.

In accordance with example embodiments, a wash optimization system integrates contamination accumulation models into wash decision processes. The system can be configured to calculate an amount of particulates that have accumulated within an engine, component, or part of an engine. The system may determine an amount of particulates that block cooling passages and/or that cause a thermal layer which impacts cooling effectiveness. These particulate determinations may be used to schedule wash events to maximize hardware life.

Contamination accumulation component 508 can apply one or more contamination accumulation models to determine particulate amounts associated with the accumulation of contaminants within the engine. Component 508 may receive sensor data, such as environmental data, which is used to estimate or predict one or more particulate amounts associated with an engine or engine component based on one or more models. In example embodiments, the particulate amounts are used to generate a compression health state 514 or a turbine health state 516. In some embodiments, data reduction component 510 is configured to assess a level of contaminants that have accumulated in an engine, module, or part. The level of contaminants may be used to generate one or more contaminant parameter values. These parameter values may be used to generate an engine or component health state as described at block 406 in process 400.

Figure 5:
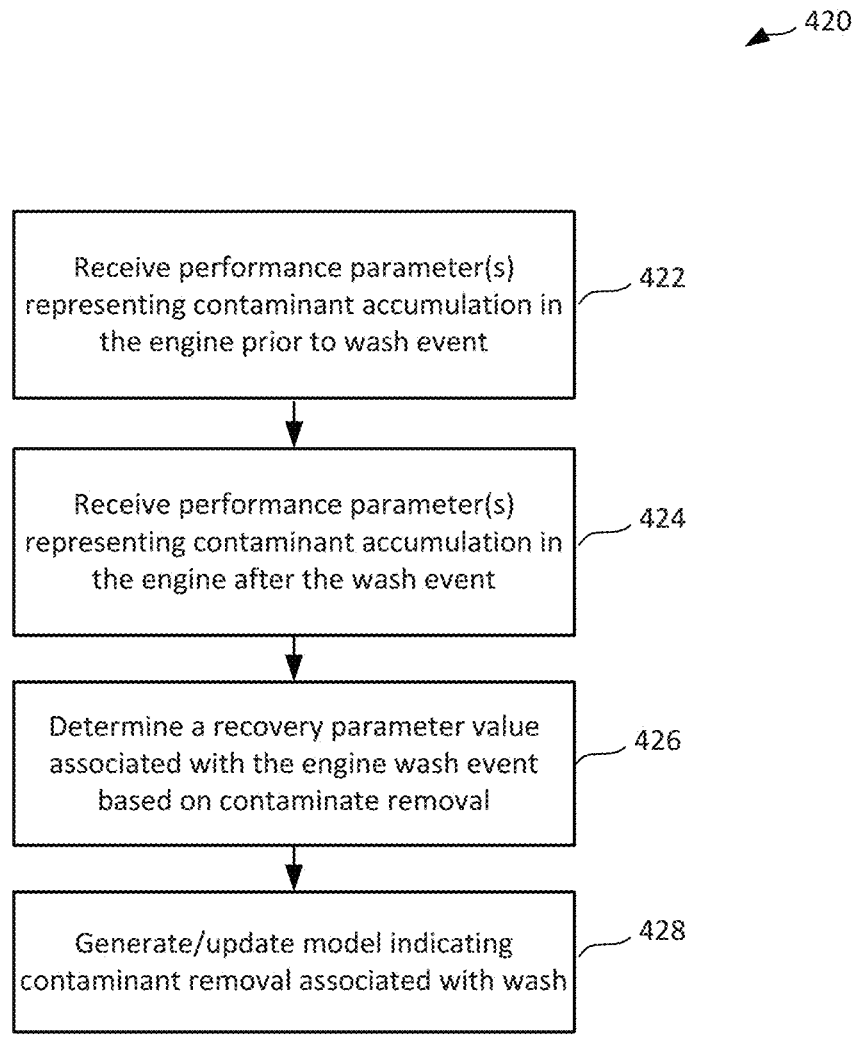
FIG. 5 is a flowchart describing example embodiments of a process for generating a contamination accumulation model.

FIG. 5 is a flowchart describing a process 420 of generating a contamination accumulation model in accordance with example embodiments. Process 420 may be performed by a wash optimization system 300 or 500 as shown in FIGS. 2 and 4, respectively. Process 420 may be implemented in or by one or more devices, such as one or more circuits or one or more specialized network devices configured to generate a contamination accumulation model. Alternatively, the process may be implemented in a processor, as processor readable code for programming a processor for example.

At 402, the system accesses or otherwise receives one or more performance parameters representing a contaminant accumulation in a turbine engine prior to a wash event. The performance parameters may be determined by contamination accumulation component 508 or data reduction component 510 in FIG. 4. Sensor data may be processed to determine an amount of contaminants such as a particular accumulation, associated with an engine, engine component, or engine part.

At 404, the system receives one or more performance parameters representing contaminant accumulation in the turbine engine after the wash event. The performance parameters at 404 can be determined as described at block 402 following the wash event.

At 406, the system determines a recovery parameter value associated with the engine wash event. For example, the system can compare one or more parameters before and after the wash event to determine a recovery value. The recovery value represents a level of contaminants that are removed by the wash event.

At 408, the system updates or generates one or more contamination accumulation models to indicate the level of contaminant removal associated with the wash. Block 408 may include adding or updating a model to include the recovery parameter value. In some embodiments, block 908 includes aggregating the parameter value with existing values to indicate removal levels.

With reference to FIG. 3, the system in some embodiments may use a contamination accumulation model at step 404 to determine performance parameters and/or at step 406 to generate a health state. As such, a wash identifier may be generated at step 408 that is based on the contamination accumulation model.

Figure 6:
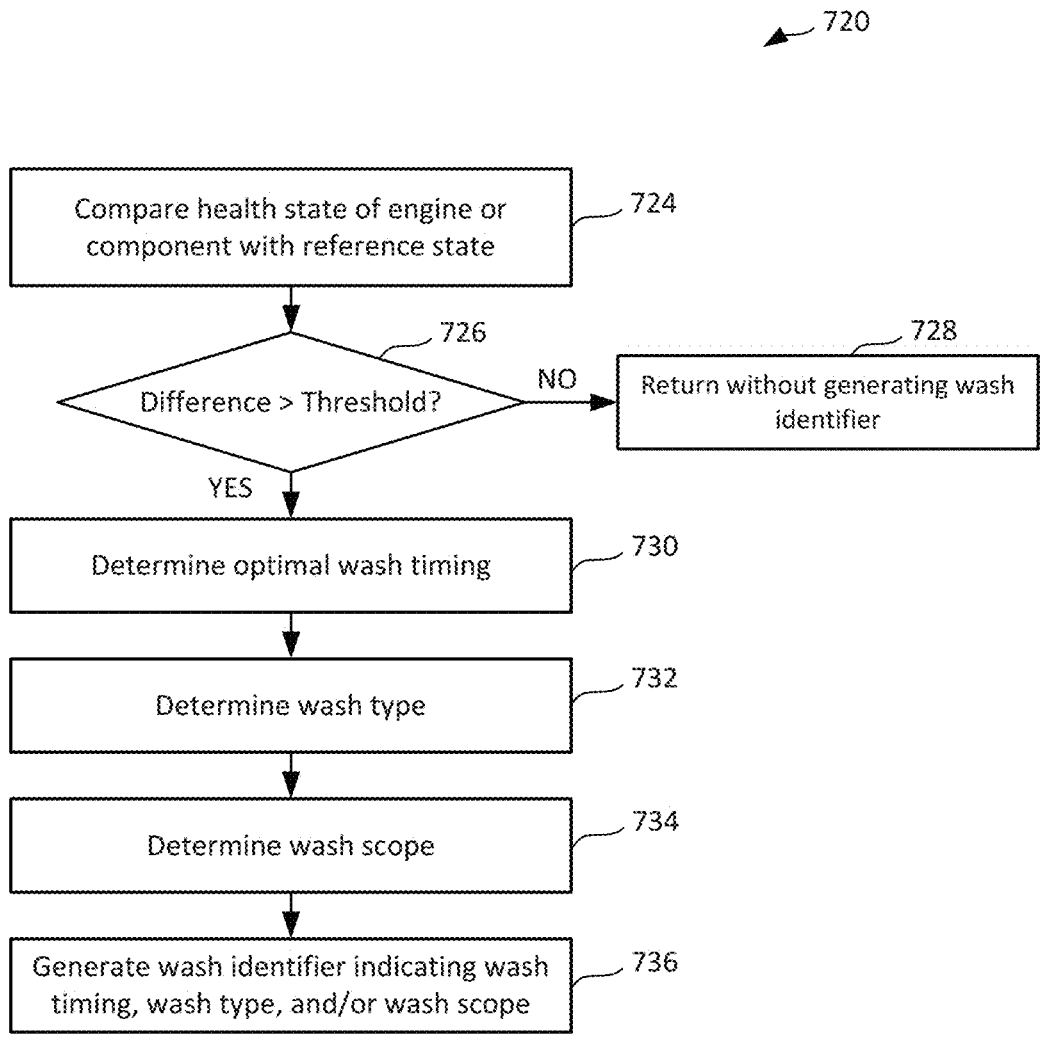
FIG. 6 is a flowchart describing example embodiments of a process for generating a wash identifier.

FIG. 6 is a flowchart describing a process 720 in accordance with example embodiments of conditionally indicating that an engine wash should be performed based on a measured condition or performance of a turbine engine. Process 720 uses a threshold criterion to determine whether a health state of the turbine engine indicates that an engine wash should be performed. Process 720 is one example of a process of generating a wash identifier that can be performed at block 408 of FIG. 3. Process 720 may be performed by a wash optimization system 300 or 500 as shown in FIGS. 2 and 4, respectively. Process 720 may be implemented in or by one or more devices, such as one or more circuits or one or more specialized network devices configured to generate wash identifiers based on health state information. Alternatively, the process may be implemented in a processor, as processor readable code for programming a processor for example.

At 724, the system compares health state information of an engine or engine component with reference state information corresponding to the engine or engine component. In some embodiments, block 724 is performed by health state component 314 in FIG. 2 or comparison unit 520 in FIG. 4. In one example, block 724 includes comparing a health state value representing an accumulated health condition of the turbine engine with a reference state value. In another example, block 724 includes comparing individual performance parameter values of a health state with reference parameter values.

At 726, the system determines whether the health state satisfies a threshold criterion. In this example, the system determines whether a difference between the health state and the reference state exceeds a threshold difference. Other techniques for determining if a threshold criterion has been satisfied can be used.

If the difference does not exceed the threshold, the process returns at block 728 without generating a wash identifier. The system determines that the threshold criteria for scheduling or performing a wash have not been met so no wash identifier is generated. In one example, block 728 includes generating an identifier that a wash should not be performed. In another example, block 728 includes not generating any identifier.

If the difference exceeds the threshold, an optimal wash timing is determined at 730. In one example, the system calculates a long term impact of washing and predicts a level of improvement associated with washing. Based on tracking the engine health information over time, the system identifies an optimized timing for the wash. The optimal timing may be based on increasing engine performance, as well as cost and efficiency considerations with removing the engine from use for the wash event.

At 732, the system determines a wash type for the wash. The wash type may include a cleaning medium, a cleaning duration, and/or a medium delivery method or apparatus. The wash type can be determined based on the health state of the engine or component to be cleaned.

At 734, the system determines a wash scope for the wash. The wash scope may identify particular portions of an engine or component to be cleaned, and/or particular components of a wash delivery apparatus to be used to deliver the cleaning medium. For example, the system may determine from the health state information particular portions of the engine with parameters below expectations. The system can select a wash scope corresponding to the particular engine portions.

At 736, the system generates a wash identifier indicating the wash timing, wash type, and/or the wash scope.

Figure 7:
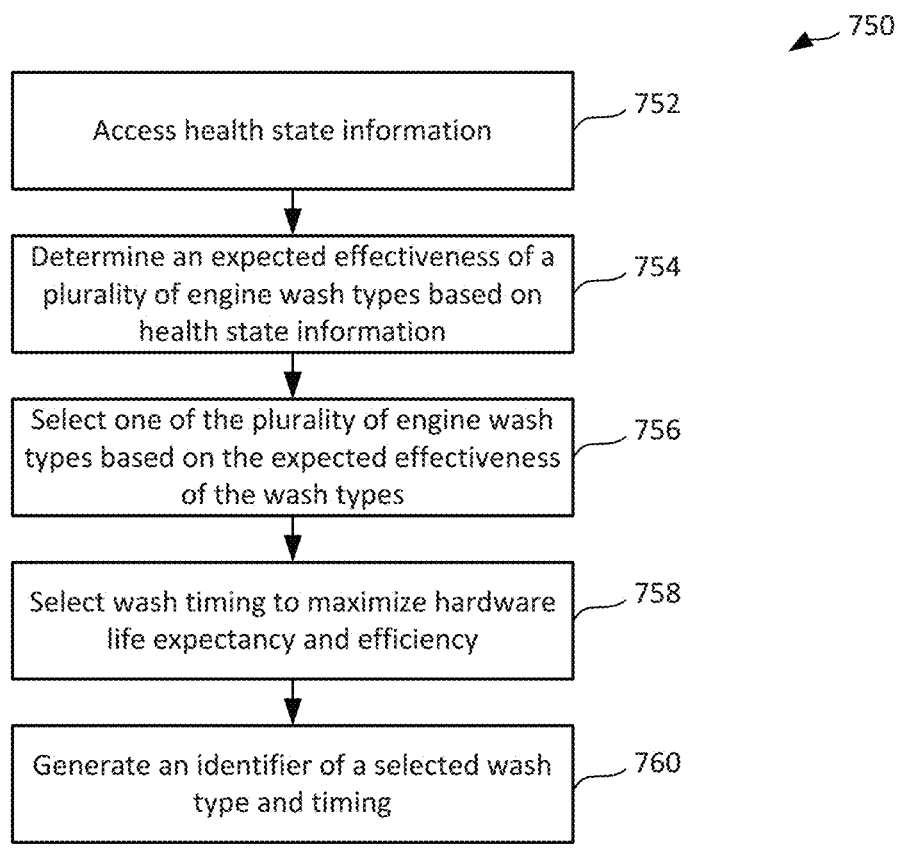
FIG. 7 is flowchart describing example embodiments of a process for determining a wash type and wash timing.

FIG. 7 is a flowchart of a process 750 in accordance with example embodiments of determining a wash type and timing for a wash event. Process 750 is one example of a process of selecting a wash type and timing and generating a wash identifier that can be performed at blocks 730 and 732 of FIG. 6 in one example. Process 750 may be performed by a wash optimization system 300 or 500 as shown in FIGS. 2 and 4, respectively. Process 750 may be implemented in or by one or more devices, such as one or more circuits or one or more specialized network devices configured to generate wash identifiers based on health state information. Alternatively, the process may be implemented in a processor, as processor readable code for programming a processor for example.

At 752, the system accesses health state information. In some embodiments, the system access engine health state information 518 or component health state information 514, 516, for example. In some embodiments, the system accesses health state comparison information as can be generated at block 724 of process 720.

At 754, the system determines an expected effectiveness of a plurality of engine wash types based on the health state information. In some embodiments, the system uses one or more models associated with different wash types. The system can input the performance parameters or health information and receive an output representing an amount performance recovery, etc. that can be achieved by the associated wash type. In some embodiments, the system receives a plurality of parameters related to engine performance and a plurality of parameters relating to a particular wash type. The wash parameters may identify wash date, time, wash device, number of wash cycles, cleaning medium, and/or other attributes that describe the wash type. Specific values or ranges of values may be used to each of the engine wash parameters. The system can determine an effectiveness of the wash type based on the performance parameters and the wash parameters. The system can generate engine parameters representing the engine performance after the wash event. The after wash engine parameters can be generated based on aggregated engine wash information, one or more models of engine wash effectiveness, etc. The system compares the received performance parameters with the performance parameters simulated for the wash event and determines an effectiveness of the wash type.

In some embodiments, the normalized performance parameters can be compared with the expected performance parameters. An appropriate wash type to place the engine parameters at or closer to the expected performance parameters can be selected. For example, if a water wash for a short duration delivered by wand will clean the engine sufficiently to meet expected performance parameters, that particular wash type can be selected. If additional cleaning by foam, alcohol, or internal delivery by wash lines, is needed, the corresponding wash type can be selected.

At 756 and 758, the system selects a wash type and wash timing, respectively, based on the expected effectiveness. In one example, the system selects the wash type having highest rated effectiveness. In other examples, the system may select a wash type based having a current highest rated effectiveness. In another example, the system selects a wash type having a highest projected level of effectiveness at a specific time in the future. The wash timing can be selected to maximize the life expectancy of the engine or component. The wash timing can also be selected to maximize efficiency of the maintenance process (e.g., reduce costs) and avoid unnecessary washes.

At 760, the system generates an identifier of the selected wash type and wash timing.

Figure 8:
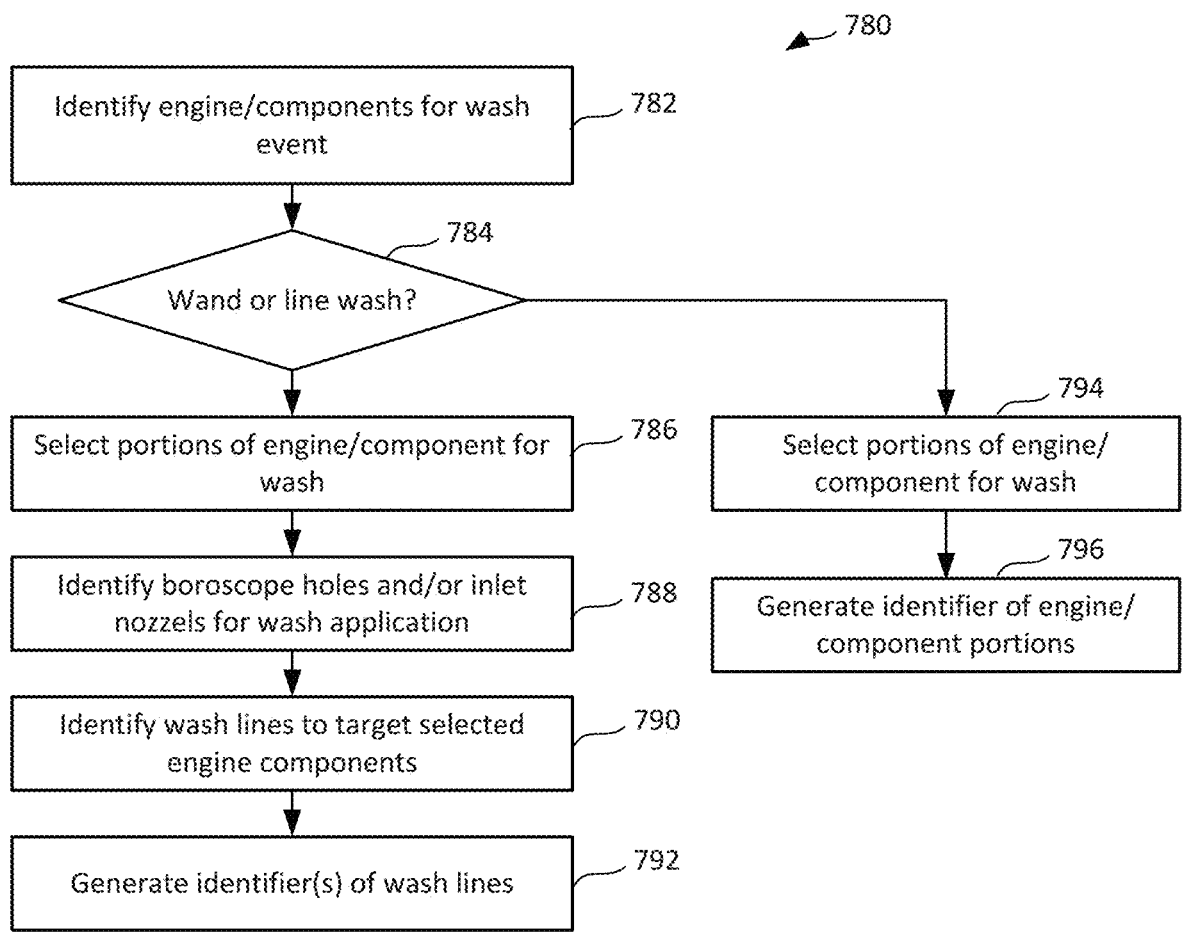
FIG. 8 is a flowchart describing example embodiments of a process for determining a wash scope.

FIG. 8 is a flowchart describing a process 780 in accordance with example embodiments of determining a wash scope for a wash event. Process 780 is one example of a process of selecting a wash scope and generating a wash identifier that can be performed at block 734 of FIG. 6 in one example. Process 780 may be performed by a wash optimization system 300 or 500 as shown in FIGS. 2 and 4, respectively. Process 780 may be implemented in or by one or more devices, such as one or more circuits or one or more specialized network devices configured to generate wash identifiers based on health state information. Alternatively, the process may be implemented in a processor, as processor readable code for programming a processor for example.

At 782, the system identifies an engine or engine component that is associated with a wash event. At 784, the system determines if the wash type of the event specifies a wand wash to be applied externally to the turbine engine or a line wash to deliver the cleaning medium internally.

If the wash type is set to a wand wash, the system selects portions of the engine or component for wash at 794. In one example, the system identifies particular engine portions based on the health state information, such as performance parameters relating to particular engine portions. At 796, the system generates one or more identifiers of the engine portion(s) to be targeted by the wand wash. In some embodiments, block 794 is omitted and the system generates an identifier to wash the engine or an engine component, without identifying particular portions thereof.

If the wash type is set to line wash, the system selects portions of the engine or engine component to be washed at 786. The portions are identified based on health state information in one example.

At 788, the system identifies particular borescope holes, booster inlets, and/or inlet nozzles and the like for application of the cleaning medium. The system may identify particular holes or nozzles through which targeted portions of the engine or component can be reached.

At 790, the system identifies wash lines, valves, etc. of the cleaning apparatus that can be used to deliver the cleaning medium to the identified borescope holes, inlet nozzles, etc. As hereinafter described, a multiple wash line system may be used where spray nozzles are attached to individual borescope holes, etc. Block 790 can include identifying particular lines, nozzles, etc. to attach to the identified borescope holes. Additionally, a wash system may include valves or a distribution manifold, etc. to control the flow of a cleaning medium to particular wash lines. Block 790 may include identifying particular valves or portions of the distribution manifold to control or vary the distribution of flow of cleaning medium to different portions of the wash system and thereby different portions of the engine or component. Each valve may be independently operable to precisely control the delivery of engine portions commensurate with the desired wash scope.

At 792, the system generates one or more identifier(s) of the particular portions of the delivery system.

Figure 9:
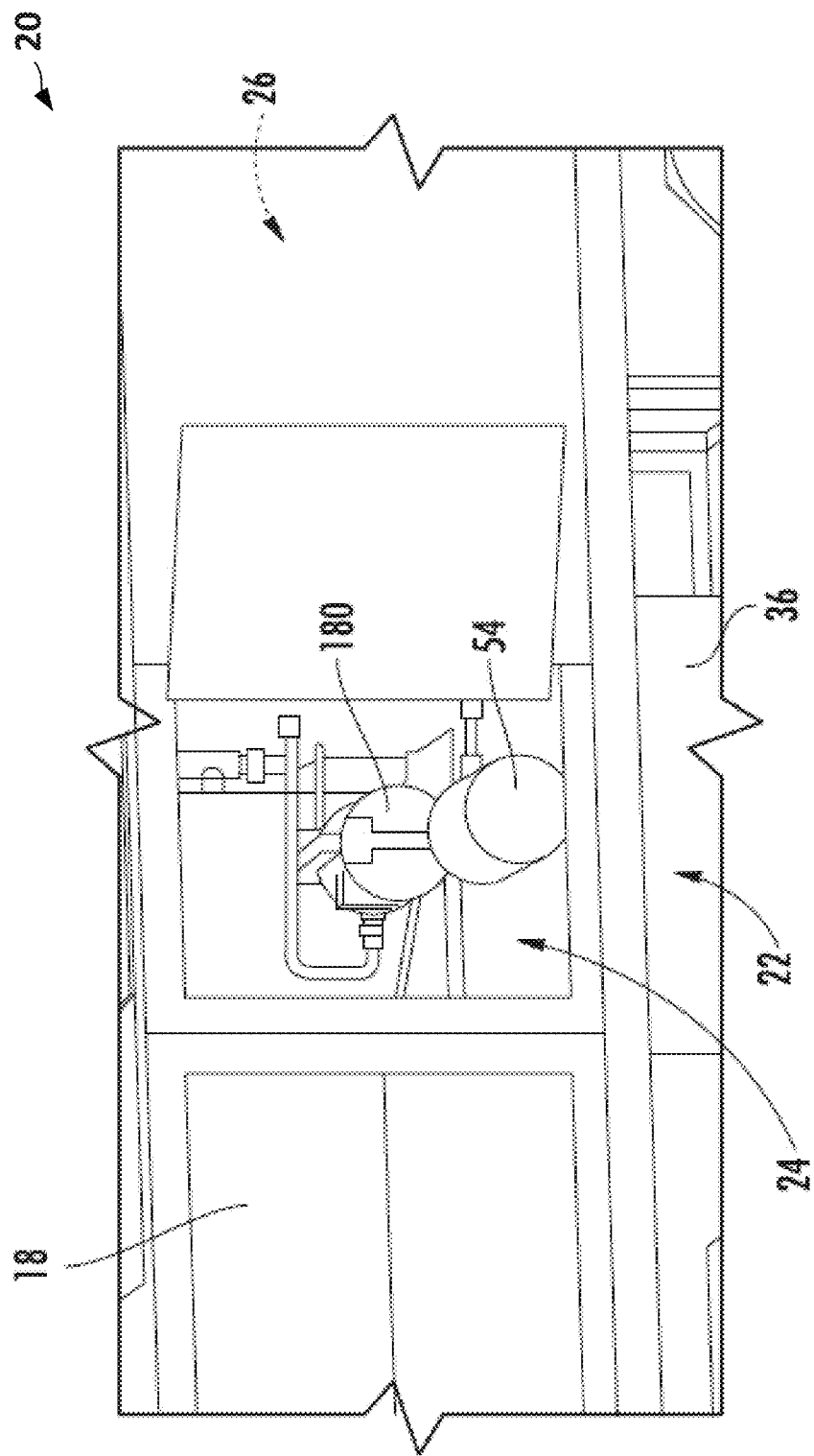
FIG. 9 is a perspective view of a wash module in accordance with example embodiments.
Figure 10:
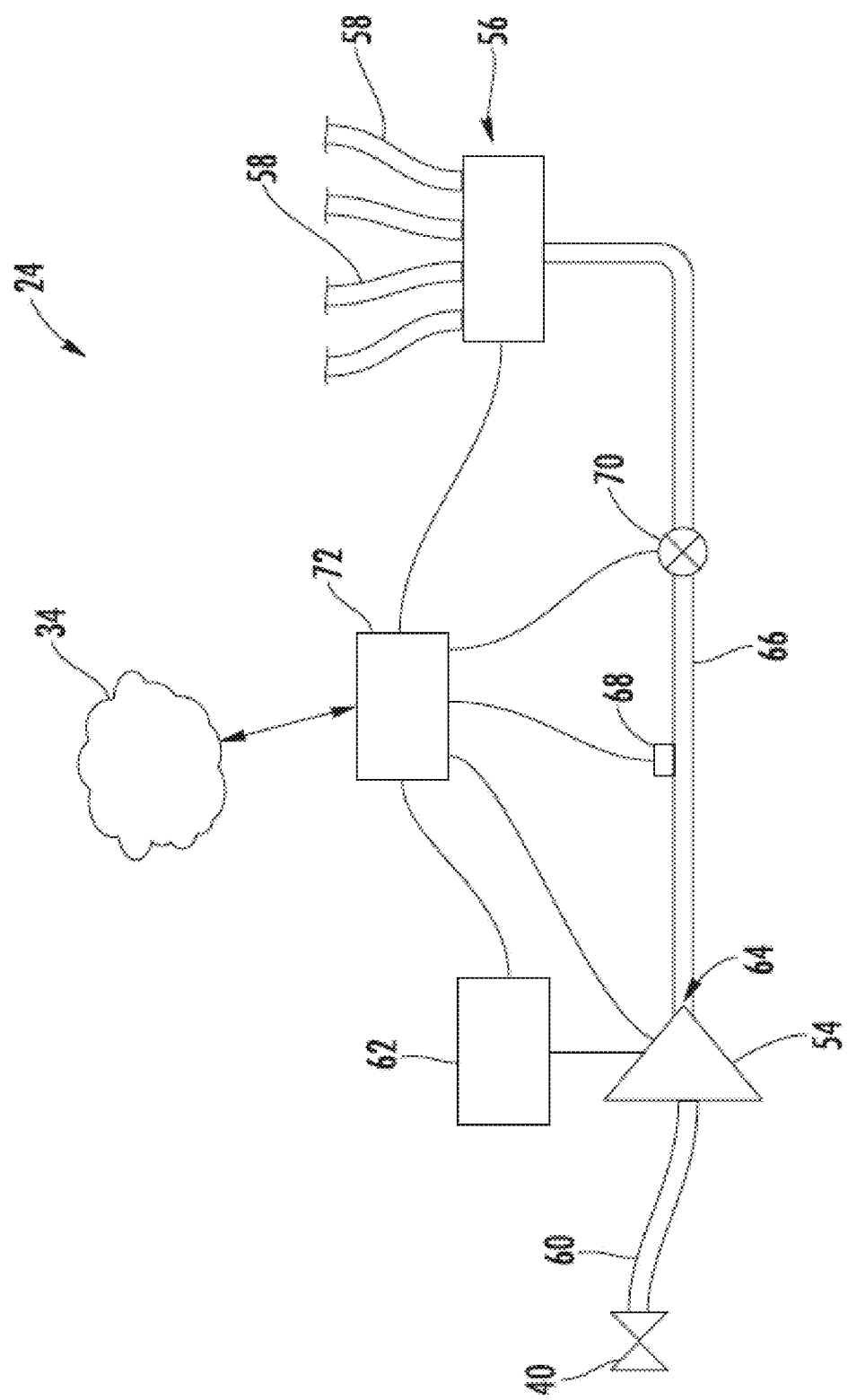
FIG. 10 is a schematic view of a wash module in accordance with example embodiments.

FIGS. 9-12 depict a wash system in accordance with example embodiments that includes a controllable distribution of cleaning medium. FIG. 9 provides a perspective view of wash module 24 as it may be contained within a modular foam cart (not shown) according to example embodiments of the present subject matter. Wash module 24 is one example of a wash system that includes multiple lines for delivery a cleaning medium internally to a turbine engine. FIG. 10 provides a schematic view of the wash module 24 in accordance with an example aspect of the present disclosure. The wash module 24 of FIGS. 9 and 10 may, in certain example embodiments, be utilized with the wash optimization systems 300 and 500 described above with reference to FIGS. 2 and 4, respectively. However, it should be appreciated, that in other embodiments the wash module 24 described with reference to FIGS. 9 and 10 may instead be utilized with any other suitable wash system, such as a single, integrated wash system.

As illustrated, the wash module 24 generally includes a pump 54, and distribution manifold 56, and a plurality of wash lines 58. More specifically the pump 54 is configured to receive a flow of wash liquid and pressurize the flow of wash liquid. The pump 54 is configured to be releasably fluidly connected to an outlet 38 of a wash tank 36 of a wash tank module 22. For example, for the embodiment depicted, the wash module 24 includes a fluid connection line 60, with the fluid connection line 60 configured to be releasably fluidly connected to an outlet 38 of a wash tank 36 of a wash tank module 22. For example, when utilized with the wash tank module 22, the fluid connection line of the wash module 24 may be releasably fluidly connected to the outlet 38 through quick release connection 40.

Although not depicted, the pump 54 may include a variable frequency drive motor, such that it may operate at various power levels. However, in other embodiments, any other suitable pump may be utilized, including any other suitable type of motor (such as a constant frequency motor). Additionally, as shown, the pump 54 is electrically connected to a power source 62, which may be a battery, or any other suitable power source. The power source 62 may provide the pump 54 with a necessary amount of electrical power to pressurize the wash liquid received to a desired pressure.

An outlet 64 of the pump 54 is fluidly connected to a duct 66 extending to the distribution manifold 56, such that the distribution manifold 56 is fluidly connected to the pump 54 for receiving a flow of pressurized wash liquid from the pump 54. For the embodiment depicted, upstream of the distribution manifold 56, the wash module 24 includes a sensor 68 for, e.g., sensing a temperature and or pressure, and a valve 70. The valve 70, for the embodiment depicted, is positioned in the duct 66 and movable between an open position allowing full flow of wash liquid through the duct 66 and a closed position, preventing any flow of wash liquid through the duct 66. In certain example embodiments, the valve 70 may be a variable throughput valve movable between various positions between the open position and the closed position to allow a desired amount of wash liquid through the duct 66.

Distribution manifold 56 is configured to receive a flow of wash liquid from the duct 66 (i.e., a flow of pressurized wash liquid from the pump 54), and distribute such flow of wash liquid to the plurality of wash lines 58. The distribution manifold 56 may be operably connected to a controller 72 of the wash module 24. Notably, the controller 72 may further be operably connected to various other components of the wash module 24. Specifically, for the embodiment depicted, the controller 72 is operably connected to the power source 62, the pump 54, the sensor 68, and the valve 70, in addition to the distribution manifold 56. The controller 72 may be configured similar to the computing device 32 of the control system 30, and may be in communication with the control system 30 of the wash system 20 through, e.g., a wireless communication network 34. For example, as will be described in greater detail below, the controller 72 may be configured to control a flow of pressurized wash liquid to the plurality of wash lines 58 through the distribution manifold 56.

Moreover, as is depicted, the plurality of wash lines 58 are fluidly connected to the distribution manifold 56 for receiving at least a portion of the pressurized wash liquid therefrom. Although for the embodiment depicted, the distribution manifold 56 is fluidly connected to four (4) wash lines 58, in other embodiments, the wash module 24 of the wash system 20 may instead include any other suitable number of wash lines 58 fluidly connected to the distribution manifold 56. As will be appreciated from the description below, the distribution manifold 56 may be configured, in certain embodiments, to distribute the flow of pressurized wash liquid in a fixed manner. For example, the distribution manifold 56 may be configured to split the flow of pressurized wash liquid substantially evenly between each of the plurality of wash lines 58 fluidly connected thereto. Additionally, or alternatively, the distribution manifold 56 may be configured to split the flow of pressurized wash liquid in an uneven manner between the plurality of wash lines 58 fluidly connected thereto (i.e., distributing more wash liquid to certain wash lines 58 than others). In still other example embodiments, the distribution manifold 56 may be configured to vary a distribution of the flow of the pressurized wash liquid between the various wash lines 58 according to, e.g., individual spray schedules for the various wash lines 58.

Figure 11:
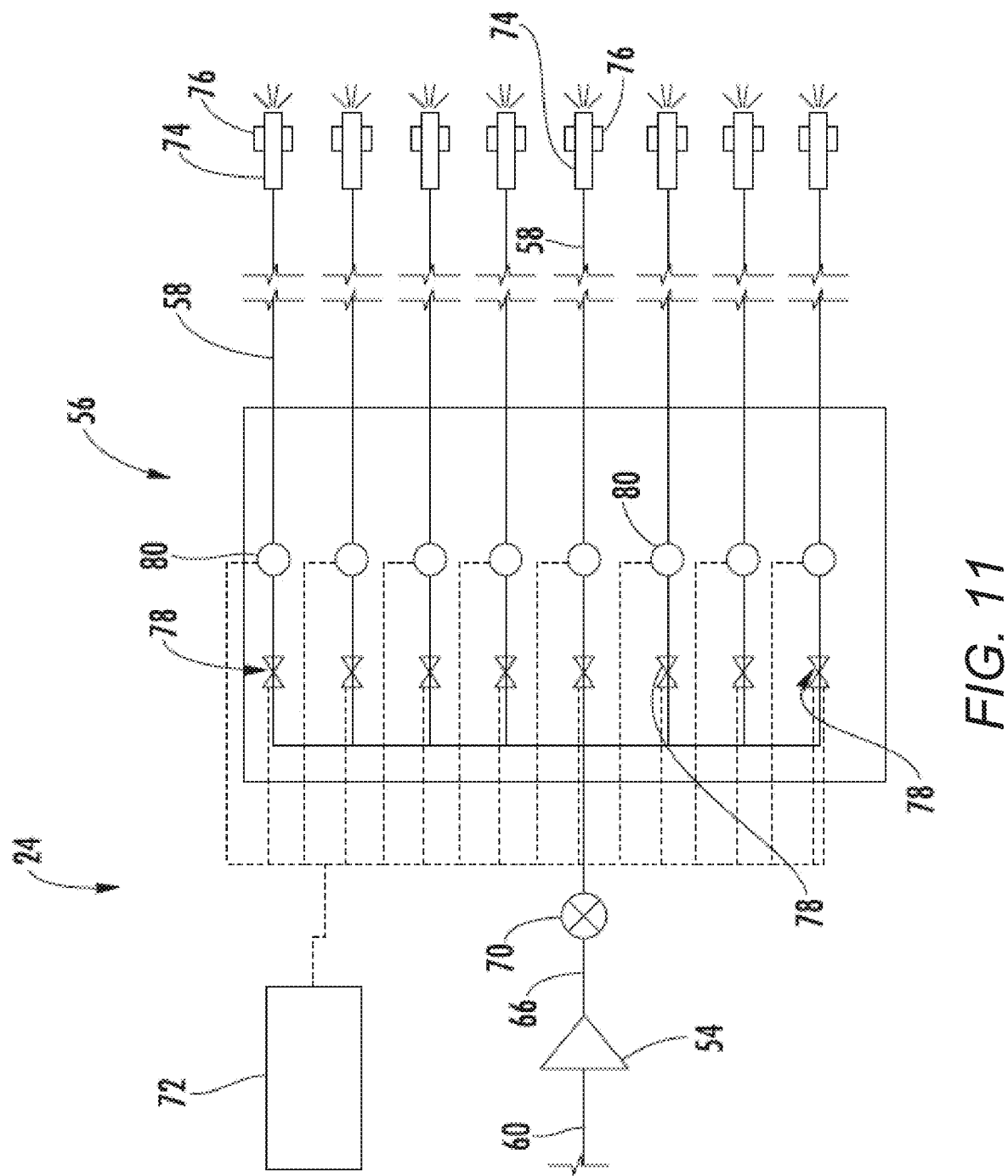
FIG. 11 is a schematic view of a distribution manifold in accordance with example embodiments, as may be incorporated in the wash module of FIG. 9.

For example, referring now to FIG. 11, a wash system, or more particularly, a wash module 24 including a distribution manifold 56, in accordance with another example embodiment of the present disclosure is depicted. As with the embodiment of FIG. 10, the example distribution manifold 56 is fluidly connected to the pump 54 of the wash module 24 via a duct 66. Additionally, as is discussed in greater detail below, the wash module 24 further includes a plurality of spray nozzles 74, with each spray nozzle 74 attached to a respective wash line 58. Each of the plurality of spray nozzles 74 includes an attachment portion 76 for attachment to a respective borescope hole in a gas turbine engine, providing a substantially air-tight and water-tight connection to a borescope hole (see, e.g., borescope hole 146 in FIG. 12).

Furthermore, the example distribution manifold 56 is configured to vary a distribution of the flow of pressurized wash liquid between the various wash lines 58. Specifically, the distribution manifold 56 includes a plurality of valves 78, with each of the plurality of valves 78 fluidly connecting a respective wash line 58 to the pump 54. Each of the valves 78 may be a variable throughput valve movable between a fully open position allowing complete flow of pressurized wash liquid therethrough, a fully closed position allowing no flow of pressurized liquid therethrough, as well as a variety of positions therebetween. For example, one or more of the variable throughput valves 78 may be configured as solenoid valves, or solenoid activated valves, or alternatively as ratio regulation valves.

Moreover, for the embodiment depicted each of the plurality of valves 78 is individually operably connected to the controller 72, such that the plurality of valves 78 are operable independently of one another. Accordingly, the controller 72 may control the plurality of valves 78 such that each operates according to its own unique flow schedule (e.g., flow rate, pressure, duration, etc.).

In addition to the plurality of valves 78, the distribution manifold 56 further includes a plurality of flow meters 80, wherein each flow meter 80 is in fluid communication with a wash line 58 of the plurality of wash lines 58 to measure a flowrate of the pressurized wash liquid flowing therethrough. More specifically, for the embodiment depicted, the distribution manifold 56 includes a flow meter 80 downstream from each of the valves 78, for measuring a flowrate of wash liquid flowing to (and through) each wash line 58. However, in other embodiments, one or more of the flow meters 80 may instead be positioned upstream of a respective valve 78, or at any other suitable location.

As with the plurality of valves 78, each of the flow meters 80 is operably connected to the controller 72, such that the controller 72 may receive information indicative of a flowrate of wash liquid through each wash line 58 from the respective flow meters 80. The controller 72 may utilize such information in controlling one or more of the plurality of valves 78. For example, the controller 72 may operate on a feedback loop to ensure wash liquid is flowing to and through a particular wash line 58 at a desired flow rate.

Figure 12:
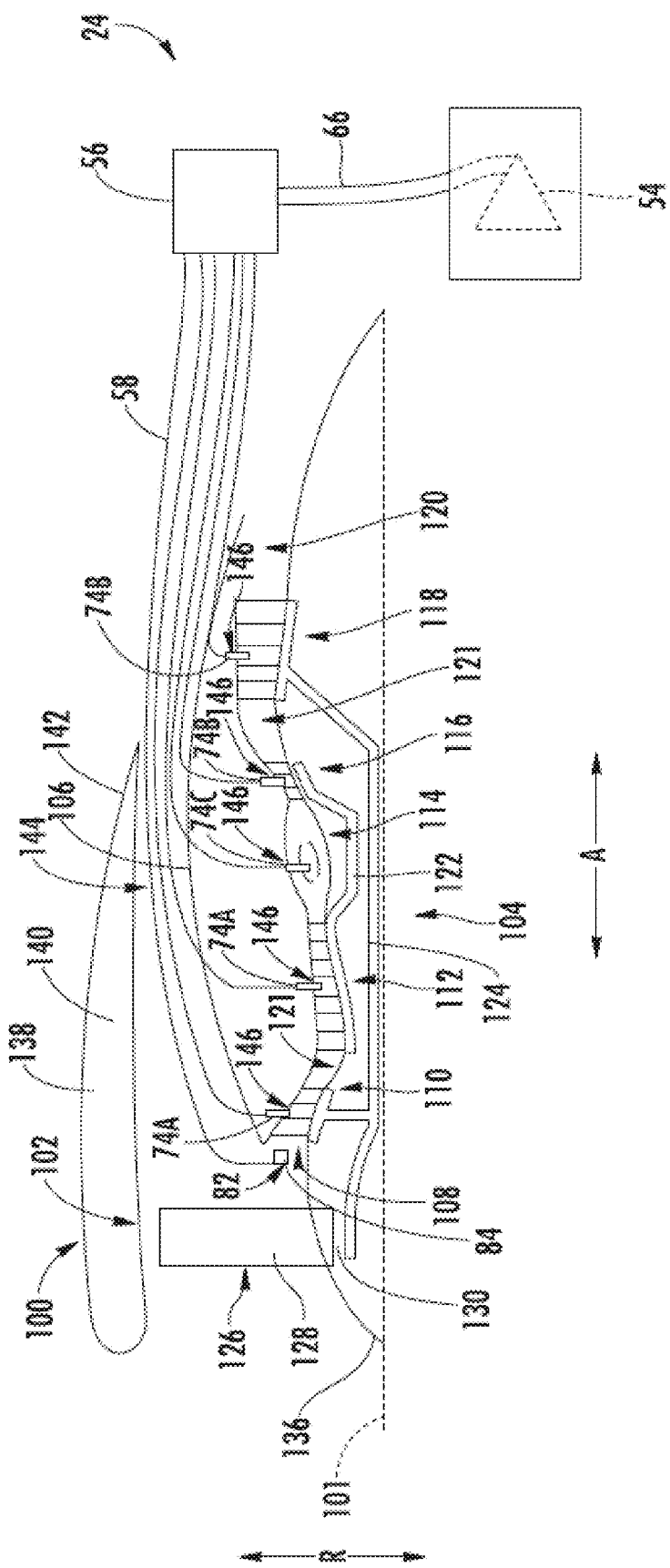
FIG. 12 is a schematic view of a wash module in accordance with example embodiments, operable with a gas turbine engine.

Referring now to FIG. 12, a schematic view of a wash module 24 of a wash system 20 in accordance with an example embodiment of the present disclosure is depicted, being utilized in washing operations of a gas turbine engine. In some embodiments, the wash module 24 of FIG. 12 may be configured in substantially the same manner as example wash module 24 described above. For example, the wash module 24 generally includes a pump 54, a distribution manifold 56 fluidly connected to the pump 54 for receiving a flow of pressurized wash fluid therefrom, and a plurality of wash lines 58 fluidly connected to the distribution manifold 56.

As stated, the wash module 24 is being utilized in the embodiment depicted in FIG. 12 in washing operations of a gas turbine engine, also depicted schematically. The gas turbine engine depicted is configured as a high bypass turbofan engine, referred to herein as "turbofan 100." As is depicted, the turbofan 100 defines an axial direction A (extending parallel to a longitudinal centerline 101 provided for reference), a radial direction R, and a circumferential direction C (extending about the axial direction A). Additionally, the turbofan 100 includes a fan section 102 and a turbine engine 104 disposed downstream from the fan section 102. The turbine engine 104 depicted generally includes a substantially tubular outer casing 106 that defines an annular inlet 108. The outer casing 106 encases, in serial flow relationship, a compressor section including a second, booster or low pressure (LP) compressor 110 and a first, high pressure (HP) compressor 112; a combustor section 114; a turbine section including a first, high pressure (HP) turbine 116 and a second, low pressure (LP) turbine 118; and a jet exhaust nozzle section 120. The compressor section, combustor section 114, and turbine section together define a core air flowpath 121 extending from the annular inlet 108 through the LP compressor 110, HP compressor 112, combustor section 114, HP turbine 116 section 116, LP turbine section 118 and jet nozzle exhaust section 120. A first, high pressure (HP) shaft or spool 122 drivingly connects the HP turbine 116 to the HP compressor 112. A second, low pressure (LP) shaft or spool 124 drivingly connects the LP turbine 118 to the LP compressor 110.

For the example embodiment depicted, the fan section 102 includes a fan 126 having a plurality of fan blades 128 coupled to a disk 130 in a spaced apart manner. As depicted, the fan blades 128 extend outwardly from disk 130 generally along the radial direction R. In certain aspects, the fan 126 may be a variable pitch fan, such that each of the plurality of fan blades 128 are rotatable relative to the disk about a pitch axis, by virtue of the plurality of fan blades being operatively coupled to an actuation member.

Referring still to the example embodiment of FIG. 12, the disk 130 is covered by rotatable front hub 136 aerodynamically contoured to promote an airflow through the plurality of fan blades 128. Additionally, the fan section 102 includes an annular fan casing or outer nacelle 138 that circumferentially surrounds the fan 126 and/or at least a portion of the turbine engine 104. The nacelle 138 is supported relative to the turbine engine 104 by a plurality of circumferentially-spaced outlet guide vanes 140. A downstream section 142 of the nacelle 138 extends over an outer portion of the turbine engine 104 so as to define a bypass airflow passage 144 therebetween.

Referring still to FIG. 12, the fan blades 128, disk 130, and front hub 136 are together rotatable about the longitudinal axis 101 directly by the LP spool 124. Accordingly, for the embodiment depicted, the turbofan engine 100 may be referred to as a "direct drive" turbofan engine. However, in other embodiments, the turbofan engine 100 may additionally include a reduction gearbox for driving the fan 126 at a reduced rotational speed relative to the LP spool 124.

Throughout the turbofan engine 100, the turbine engine 104 defines a plurality of borescope holes 146. Specifically, for the embodiment depicted, the turbine engine 104 includes one or more borescope holes 146 defined in the compressor section, in the combustor section 114, and in the turbine section. More specifically, still, for the embodiment depicted, the turbine engine 104 includes one or more borescope holes 146 defined in the LP compressor 110, the HP compressor 112, a combustion chamber of the combustor section 114, the HP turbine 116, and the LP turbine 118. The borescope holes 146 may allow for inspection of the turbine engine 104 between operations, and more specifically, may open into the core air flowpath 121 of the turbofan engine 100 to allow for inspection of, e.g., one or more blades, nozzles, or combustion liners of the turbofan engine 100 between operations. By contrast, during normal operations, the borescope holes 146 within the combustor section 114 and turbine section may be plugged with a borescope plug (not shown), such that the borescope holes 146 do not affect operation of the turbofan engine 100.

Moreover, as previously stated, the turbofan engine 100 is depicted schematically as being cleaned by the wash module 24 of the wash system 20. More specifically, the wash module 24 of the wash system 20 further includes a plurality of spray nozzles 74, each of the plurality of spray nozzles 74 attached to a respective wash line 58 and configured for extending at least partially into or through one of the borescope holes 146 of the turbofan engine 100 for providing at least a portion of the flow of the pressurized wash liquid to the turbofan engine 100. More specifically, the plurality of spray nozzles 74 may provide at least a portion of the flow of pressurized wash liquid directly to the core air flowpath 121 of the turbine engine 104, at a location downstream from the inlet 108. It should be appreciated, that in certain embodiments, the plurality of spray nozzles 74 may extend at least partially into or through borescope holes 146 of the turbofan engine 100 at locations spaced along, e.g., the circumferential direction C of the turbofan engine 100. Such a configuration may allow for a more even cleaning of the turbofan engine 100, or rather of the turbine engine 104, during such wash operations.

Referring still to FIG. 12, for the embodiment depicted, the plurality of spray nozzles 74 includes a compressor spray nozzle 74A for extending at least partially into or through one of the borescope holes 146 defined in the compressor section of the turbofan engine 100, as well as a turbine spray nozzle 74B for extending at least partially into or through one of the borescope holes 146 defined in the turbine section of the turbofan engine 100. Further, for the embodiment depicted, the plurality spray nozzles 74 includes a combustor section spray nozzle 74C for extending at least partially into or through one of the borescope holes 146 defined in a combustion chamber of the combustor section 114 of the gas turbine engine.

More specifically, for the embodiment depicted, the compressor spray nozzle 74A includes a plurality of compressor spray nozzles 74A (a first plurality of spray nozzles 74 positioned within borescope holes 146 in a first region of the turbofan engine 100), with at least one spray nozzle 74A extending into or through a borescope hole 146 defined in the LP compressor 110 and at least one spray nozzle 74A extending into or through a borescope hole 146 defined in the HP compressor 112. Further, for the embodiment depicted, the turbine spray nozzle 74B includes a plurality of turbine spray nozzles 74B (a second plurality of spray nozzles 74 positioned within borescope holes 146 in a second region of the turbofan engine 100), with at least one spray nozzle 74B extending into or through a borescope hole 146 defined in the HP turbine 116 and at least one spray nozzle 74B extending into or through a borescope hole 146 defined in the LP turbine 118.

Additionally, the wash module 24 further includes an inlet nozzle assembly 82 fluidly connected to one or more of the plurality of wash lines 58 for providing at least a portion of the flow of pressurized wash liquid to the turbofan engine 100, or rather to the turbine engine 104, through the inlet 108 of the turbine engine 104. As is depicted, the inlet nozzle assembly 82 includes one or more inlet nozzles 84 positioned proximate the inlet 108 to the turbine engine 104 to spray wash liquid directly into and through the inlet 108 of the turbine engine 104. In other embodiments, however, the inlet nozzle assembly 82 may instead be located at least partially forward of the fan 126.

Referring still to FIG. 12, as noted above, the turbofan engine 100 includes the outer nacelle 138 which defines the bypass passage 144 with the turbine engine 104. For the embodiment depicted, the plurality of wash lines 58 extend from an aft end of the turbine engine 104, through the bypass passage 144 to each of the respective plurality of borescope holes 146, and to the inlet 108 for the inlet nozzle assembly 82. With such a configuration, the wash system 20 may operate without having to remove one or more portions of the fan section 102. More specifically, a wash system having such a configuration may allow for conducting washing operations (i.e., providing pressurized wash liquid through the plurality of wash lines and wash nozzles), while allowing for the turbofan engine to be cranked or rotated using, e.g., a starter motor or turning tool 172, to increase in effectiveness of the washing operations. In addition, a controller, such as a system controller or controller 52, can automatically control the speed of the engine core rotation to improve cleaning performance or to prevent unwanted wash fluid intrusion into internal engine air circuits or other passageways. Moreover, such a controller can be configured for monitoring motor torque, e.g., to protect gearbox components.

Utilizing a wash system in accordance with one or more of the example embodiments described herein may allow for efficient cleaning of the gas turbine engine. More specifically, by providing a wash liquid directly to a core air flowpath of the turbine engine of the gas turbine engine may allow the wash system to provide such portions with heated and pressurized wash liquid. By contrast to prior configurations, in which wash liquid is provided solely at an inlet to the turbine engine (in which case such wash liquid may be neither pressurized nor heated by the time it reaches e.g., a turbine section), providing wash liquid directly to e.g., a turbine section of the turbine engine may allow the wash system to provide heated and pressurized wash liquid to such section. Additionally, embodiments including the individual valves fluidly connecting wash lines to a pump in a distribution manifold may allow for relatively precise cleaning of the gas turbine engine and/or targeted cleaning of a gas turbine engine. Moreover, the duration of the cleaning cycle may be adjusted, the density of the cleansing foam may be altered, and other adjustments to the cleaning cycle may be adjusted to improve cleaning efficiency.

Figure 13:
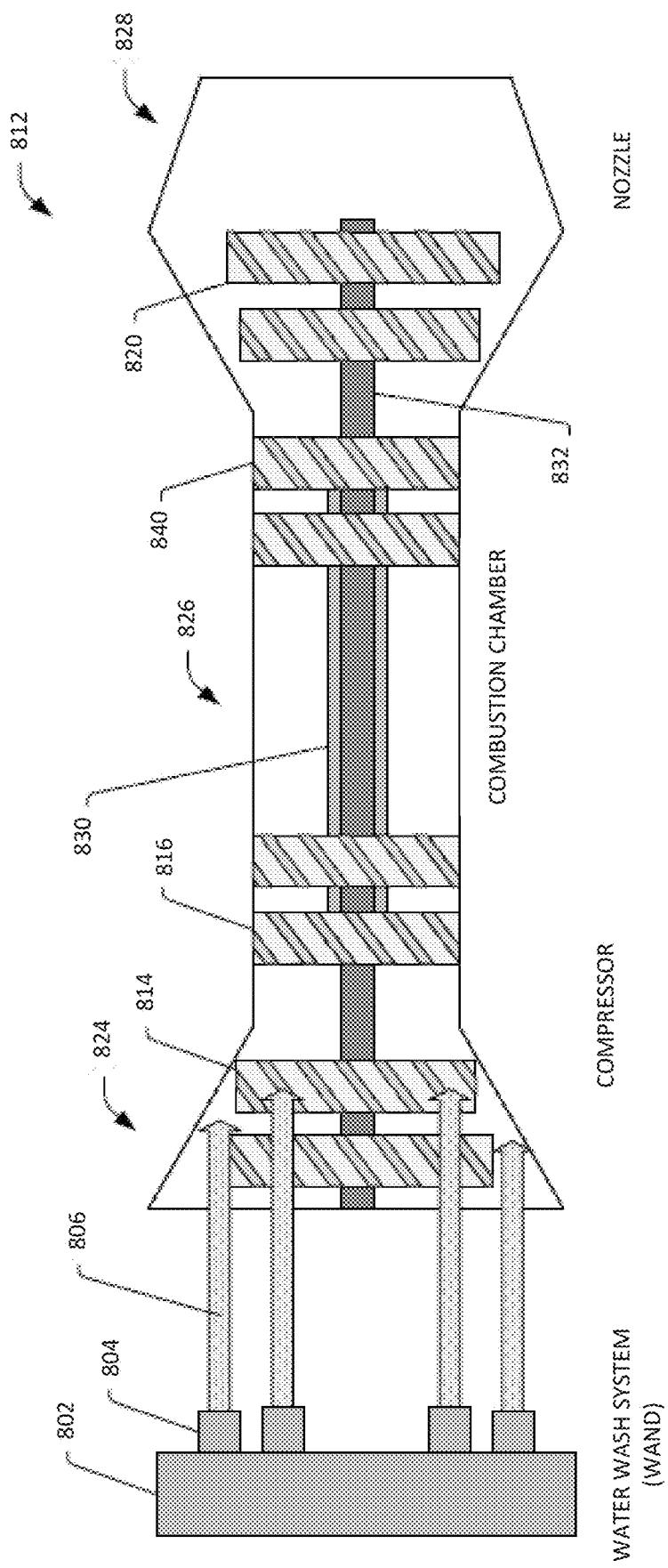
FIG. 13 is a block diagram depicting a wash system including a wand in accordance with example embodiments.

FIG. 13 depicts a wash system 802 in accordance with example embodiments that includes a wand for delivering a cleaning medium. Wash system 802 is one example of a wash system that includes a wand for delivery of a cleaning medium externally to a turbine engine.

In FIG. 13, a simplified diagram is depicted illustrating a water-wash operation performed on jet engine 812. In this example, a water-wash system or wand 802 comprises a set of water injection nozzles 804 that inject streams of water or a cleaning solution 806 into the inlet of compressor 824, thereby removing accumulated contaminants from the compressor 824 and restoring performance levels. In this example, wand 802 includes four injection nozzles, but it will be appreciated that a wand may have any number of injection nozzles. Additionally, wand 802 may include additional structural components not shown. For example, wand 802 may include a handle to enable user hand-held operation or a member for attaching the wand to a vehicle or other portion of a wash system.

A water-wash operation can be carried out as an off-line process whereby the water-wash is applied while the jet engine is not operating (e.g., as a ground-based operation). In such scenarios, the water-wash system 802 may be a separate system may be a separate machine that can be directed to the inlet of the compressor 824 while the jet engine is grounded. Alternatively, a water-wash operation may be carried out as an on-line (on-wing) process whereby an integrated water-wash injection is directed to the inlet of the compressor 824 during operation of the jet engine 812

Figure 14:
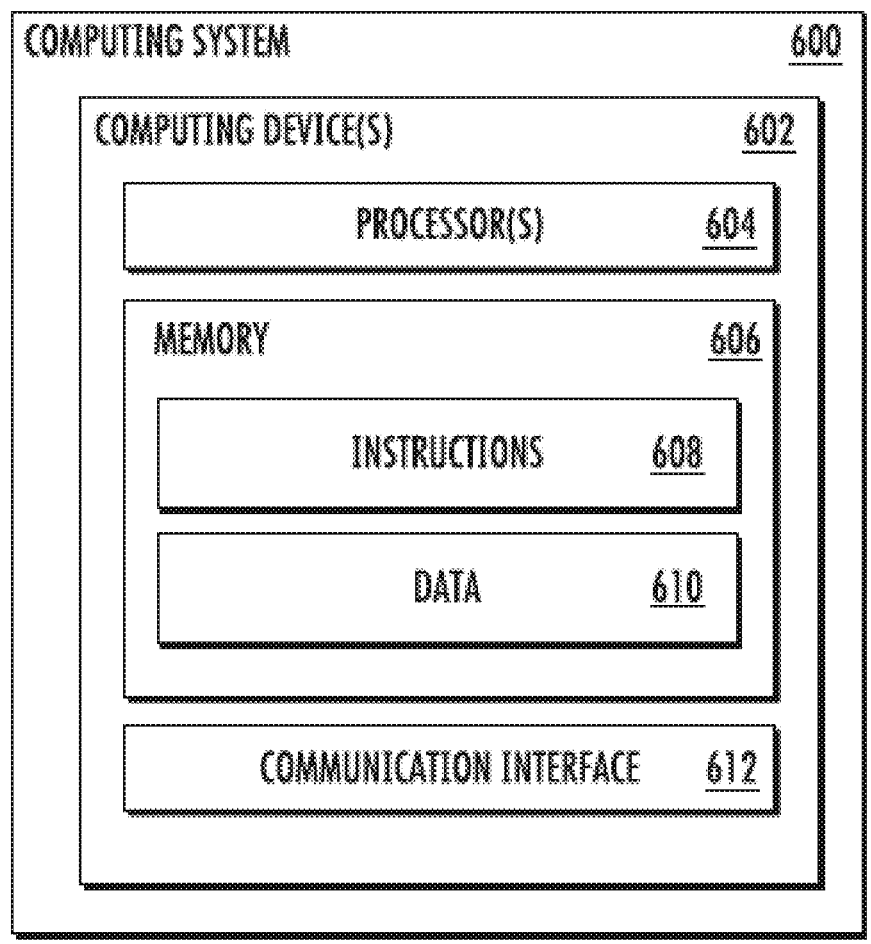
FIG. 14 is a block diagram of an example of a computing system.

FIG. 14 depicts a block diagram of an example computing system 600 that can be used by an aerial vehicle, a ground system, or other systems of the aerial vehicle to implement methods and systems according to example embodiments of the present disclosure. As shown, the computing system 600 can include one or more computing device(s) 602. The one or more computing device(s) 602 can include one or more processor(s) 604 and one or more memory device(s) 606. The one or more processor(s) 604 can include any suitable processing device, such as a microprocessor, microcontroller, integrated circuit, logic device, or other suitable processing device. The one or more memory device(s) 606 can include one or more computer-readable media, including, but not limited to, non-transitory computer-readable media, RAM, ROM, hard drives, flash drives, or other memory devices.

The one or more memory device(s) 606 can store information accessible by the one or more processor(s) 604, including computer-readable instructions 608 that can be executed by the one or more processor(s) 604. The instructions 608 can be any set of instructions that when executed by the one or more processor(s) 604, cause the one or more processor(s) 604 to perform operations. The instructions 608 can be software written in any suitable programming language or can be implemented in hardware. In some embodiments, the instructions 608 can be executed by the one or more processor(s) 604 to cause the one or more processor(s) 604 to perform operations, such as the operations for selecting an engine wash type, as described with reference to FIG. 2 and/or FIG. 5, and/or any other operations or functions of the one or more computing device(s) 602.

The memory device(s) 606 can further store data 610 that can be accessed by the processors 604. For example, the data 610 can include one or more parameters related to engine performance, engine health data, operational data, derate history, environmental data, engine cycle information, etc., as described herein. The data 610 can include one or more table(s), function(s), algorithm(s), model(s), equation(s), etc. for selecting an engine wash type according to example embodiments of the present disclosure.

The one or more computing device(s) 602 can also include a communication interface 612 used to communicate, for example, with the other components of system. The communication interface 612 can include any suitable components for interfacing with one or more network(s), including for example, transmitters, receivers, ports, controllers, antennas, or other suitable components.

The technology discussed herein makes reference to computer-based systems and actions taken by and information sent to and from computer-based systems. One of ordinary skill in the art will recognize that the inherent flexibility of computer-based systems allows for a great variety of possible configurations, combinations, and divisions of tasks and functionality between and among components. For instance, processes discussed herein can be implemented using a single computing device or multiple computing devices working in combination. Databases, memory, instructions, and applications can be implemented on a single system or distributed across multiple systems. Distributed components can operate sequentially or in parallel.

Although specific features of various embodiments may be shown in some drawings and not in others, this is for convenience only. In accordance with the principles of the present disclosure, any feature of a drawing may be referenced and/or claimed in combination with any feature of any other drawing.

This written description uses examples to disclose the claimed subject matter, including the best mode, and also to enable any person skilled in the art to practice the claimed subject matter, including making and using any devices or systems and performing any incorporated methods. The patentable scope of the disclosed technology is defined by the claims, and may include other examples that occur to those skilled in the art. Such other examples are intended to be within the scope of the claims if they include structural elements that do not differ from the literal language of the claims, or if they include equivalent structural elements with insubstantial differences from the literal languages of the claims.

What is claimed is:

1. A method comprising:
   generating, by a system comprising at least one processor, a health state of an engine or an engine component;
   determining, by the system, a difference between the health state of the engine or the engine component and a reference state corresponding to the engine or the engine component;
   determining, by the system, that the difference between the health state and the reference state exceeds a threshold difference; and
   generating, by the system, a wash identifier including a wash scope comprising:
   one or more portions or components of the engine identified to be washed, the one or more portions or components of the engine identified based on the difference between the health state and the reference state.

2. The method of claim 1, wherein the health state of the engine or the engine component comprises at least one of: an accumulated health condition of the engine, and an individual performance parameter value of the engine or the engine component.

3. The method of claim 1, wherein the reference state comprises sensor data indicative of an expected condition or a performance of one or more engine parameters.

4. The method of claim 1, wherein generating, by the system, the wash identifier further comprises determining, by the system, at least one of: a wash timing or a wash type.

5. The method of claim 4, wherein the wash timing comprises a timing for, or interval during which to perform, an engine wash; wherein the wash type comprises at least one of: a wash medium, a wash duration, a wash delivery method, and a wash delivery system.

6. The method of claim 1, comprising:
   generating the health state of the engine or the engine component based at least in part on one or more particulate values and a contamination accumulation model that predicts particulate accumulation within the engine.

7. The method of claim 6, comprising:
   receiving environmental data and using the environmental data in the contamination accumulation model to predict the particulate accumulation within the engine.

8. The method of claim 1, comprising:
   determining, by the system, an expected effectiveness of a plurality of engine wash types based at least in part on the health state; and
   generating the wash identifier based at least in part on the expected effectiveness of the plurality of engine wash types, wherein the wash identifier comprises a wash type selected from among the plurality of engine wash types.

9. The method of claim 8, wherein the wash type selected from among the plurality of engine wash types has a highest expected effectiveness.

10. The method of claim 9, wherein the highest expected effectiveness comprises at least one of: a current highest rated effectiveness, and a highest projected level of effectiveness at a specific time in the future.

11. The method of claim 1, wherein the wash identifier comprise a wash type, and wherein the wash type comprises at least one of: a wand wash to be applied externally, and a line wash to deliver a cleaning medium internally.

12. A computing device, comprising:
   one or more storage devices comprising processor readable code; and
   one or more processors in communication with the one or more storage devices, the one or more processors configured to execute the processor readable code, wherein the processor readable code, when executed by the one or more processors, causes the one or more processors to:
   generate a health state of an engine or an engine component;
   determine a difference between the health state of the engine or the engine component and a reference state corresponding to the engine or the engine component;
   determine whether the difference between the health state and the reference state exceeds a threshold difference; and
   generate a wash identifier when the difference between the health state and the reference state exceeds the threshold difference, the wash identifier including a wash scope comprising:

one or more portions or components of the engine identified to be washed, the one or more portions or components of the engine identified based on the difference between the health state and the reference state.

13. The computing device of claim 12, wherein the health state of the engine or the engine component comprises at least one of: an accumulated health condition of the engine and an individual performance parameter value of the engine or the engine component.

14. The computing device of claim 12, wherein the reference state comprises sensor data indicative of an expected condition or a performance of one or more engine parameters.

15. The computing device of claim 12, wherein the wash identifier further comprises at least one of: a wash timing or a wash type.

16. The computing device of claim 15, wherein the wash timing comprises a timing for, or interval during which to perform, an engine wash; wherein the wash type comprises at least one of: a wash medium, a wash duration, a wash delivery method, and a wash delivery system.

17. The computing device of claim 12, wherein the processor readable code, when executed by the one or more processors, causes the one or more processors to:
generate the health state of the engine or the engine component based at least in part on one or more particulate values and a contamination accumulation model that predicts particulate accumulation within the engine.

18. The computing device of claim 12, wherein the processor readable code, when executed by the one or more processors, causes the one or more processors to:
generate an identifier that a wash should not be performed when the difference between the health state and the reference state does not exceed the threshold difference.

19. The computing device of claim 12, wherein the processor readable code, when executed by the one or more processors, causes the one or more processors to:
determine an expected effectiveness of a plurality of engine wash types based at least in part on the health state; and
generate the wash identifier based at least in part on the expected effectiveness of the plurality of engine wash types, wherein the wash identifier comprises a wash type selected from among the plurality of engine wash types.

20. A wash system for a turbine engine, the wash system comprising:
one or more sensors configured to provide sensor data pertaining to one or more measured engine parameters of a turbine engine;
a computing system comprising a non-transitory computer-readable medium and one or more processors; and
a communication bus communicatively coupling the one or more sensors and the computing system;
wherein the computer-readable medium comprises computer-executable instructions, which when executed by the one or more processors, causes the one or more processors to perform a method comprising:
determining, based at least in part on the sensor data, health state information pertaining to the turbine engine or to a component of the turbine engine, wherein the health state information comprises at least one of: a difference between a health state and a reference state, and a comparison of the difference between the health state and the reference state to a threshold difference;
determining an expected effectiveness of a plurality of engine wash types based at least in part on the health state information; and
generating a wash identifier based at least in part on the expected effectiveness of the plurality of engine wash types, wherein the wash identifier comprises a wash type selected from among the plurality of engine wash types, the wash identifier including a wash scope comprising:
one or more portions or components of the engine identified to be washed, the one or more portions or components of the engine identified based on the health state information.

* * * * *